(12) United States Patent
Seo et al.

(10) Patent No.: US 11,974,477 B2
(45) Date of Patent: Apr. 30, 2024

(54) DISPLAY DEVICE

(71) Applicant: Samsung Display Co., LTD., Yongin-si (KR)

(72) Inventors: Il Hun Seo, Asan-si (KR); Joo Sun Yoon, Seoul (KR); Woo Sik Jun, Seongnam-si (KR); Yun-Mo Chung, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/296,555

(22) Filed: Apr. 6, 2023

(65) Prior Publication Data
US 2023/0329055 A1 Oct. 12, 2023

(30) Foreign Application Priority Data
Apr. 7, 2022 (KR) .................. 10-2022-0043601

(51) Int. Cl.
*H10K 59/131* (2023.01)
*G09G 3/3233* (2016.01)
*H10K 59/80* (2023.01)

(52) U.S. Cl.
CPC ......... *H10K 59/131* (2023.02); *G09G 3/3233* (2013.01); *H10K 59/873* (2023.02); *G09G 2300/0408* (2013.01); *G09G 2300/0819* (2013.01); *G09G 2300/0842* (2013.01)

(58) Field of Classification Search
CPC .. H10K 59/131; H10K 59/873; G09G 3/3233; G09G 2300/0408; G09G 2300/0819; G09G 2300/0842
See application file for complete search history.

(56) References Cited

U.S. PATENT DOCUMENTS

| 2020/0161398 | A1* | 5/2020 | Bang | H01L 23/293 |
| 2022/0298279 | A1 | 9/2022 | Yun et al. | |
| 2022/0344441 | A1* | 10/2022 | Lee | G06F 3/0445 |
| 2022/0399523 | A1* | 12/2022 | Gao | H10K 50/8426 |

(Continued)

FOREIGN PATENT DOCUMENTS

| CN | 109448616 | 3/2019 |
| KR | 10-2020-0058882 | 5/2020 |

(Continued)

*Primary Examiner* — Dmitriy Bolotin
(74) *Attorney, Agent, or Firm* — KILE PARK REED & HOUTTEMAN PLLC

(57) ABSTRACT

A display device includes a display panel including a display area, a driving circuit area, a driving wire area, and a sealing area. The display panel includes a first substrate, a plurality of light-emitting devices disposed on the first substrate in the display area, a gate driver disposed on the first substrate in the driving circuit area and supplying a signal for driving the light-emitting device, a plurality of wires disposed on the first substrate in the driving wire area and transmitting a clock signal to the gate driver, and an organic structure disposed on the first substrate in the driving wire area, the plurality of wires include a scan clock signal wire for transmitting a scan clock signal, and a sensing clock signal wire for transmitting a sensing clock signal, and the scan clock signal wire and the sensing clock signal wire do not overlap the organic structure.

20 Claims, 12 Drawing Sheets

(56) References Cited

U.S. PATENT DOCUMENTS

| | | | |
|---|---|---|---|
| 2023/0118463 A1* | 4/2023 | Zhang | H10K 50/822 |
| | | | 257/40 |
| 2023/0180571 A1 | 6/2023 | Choi | |
| 2023/0180584 A1* | 6/2023 | Li | G06F 3/0412 |
| | | | 345/174 |
| 2023/0269961 A1* | 8/2023 | Kang | H10K 50/844 |
| | | | 257/72 |
| 2023/0329055 A1* | 10/2023 | Seo | H10K 59/873 |
| 2023/0421732 A1* | 12/2023 | Tal | G06V 20/176 |
| 2023/0422593 A1* | 12/2023 | Lee | H10K 59/1216 |

FOREIGN PATENT DOCUMENTS

| | | |
|---|---|---|
| KR | 10-2021-0052782 | 5/2021 |
| KR | 10-2021-0090334 | 7/2021 |
| KR | 10-2022-0129721 | 9/2022 |
| KR | 10-2023-0085263 | 6/2023 |

\* cited by examiner

DISPLAY DEVICE

CROSS-REFERENCE TO RELATED APPLICATION

This application claims priority to and the benefits of Korean Patent Application No. 10-2022-0043601 under 35 U.S.C. § 119, filed on Apr. 7, 2022, in the Korean Intellectual Property Office (KIPO), the entire contents of which are incorporated herein by reference.

BACKGROUND

1. Technical Field

The disclosure relates to a display device.

2. Description of the Related Art

A display device is a device for displaying images on a screen, and it may be a liquid crystal display (LCD) or an organic light emitting diode display (OLED). The display device is used in various electronic devices such as portable phones, GPSs, digital cameras, electronic books, portable game devices, or various terminals.

The organic light emitting device includes two electrodes and an organic emission layer disposed therebetween, and electrons injected from one electrode are combined with holes injected from another electrode in an organic emission layer to form excitons. The excitons transit to a ground state from an excited state to output energy and emit light.

Recently, display devices further including a color conversion panel for the purpose of reducing an optical loss and realizing the display device with high color reproducibility have been proposed. The color conversion panel may include semiconductor nanocrystals such as quantum dots, and may convert incident light into different colors.

The color conversion panel may be bonded to an organic light emitting panel on which light-emitting devices are formed. The color conversion panel and the organic light emitting panel may be sealed by a sealing member positioned therebetween. When moisture or impurities pass through the sealing member and enter into the display device in a high-temperature and high-moisture condition, capacitance of wires may increase, and problems such as signal delays, luminance differences, and visible stripes may be generated.

The above information disclosed in this Background section is only for enhancement of understanding of the background of the described technology, and therefore it may contain information that does not form the prior art that is already known in this country to a person of ordinary skill in the art.

SUMMARY

The disclosure has been made in an effort to provide a display device for preventing signals applied to respective wires from being distorted by permeated moisture entered into the display device.

A display device may include a display panel including a display area, a driving circuit area, a driving wire area, and a sealing area. The display panel may further include a first substrate, a plurality of light-emitting devices disposed on the first substrate in the display area, a gate driver disposed on the first substrate in the driving circuit area and supplying a signal for driving the plurality of light-emitting devices, a plurality of wires disposed on the first substrate in the driving wire area and transmitting a clock signal to the gate driver, and an organic structure disposed on the first substrate in the driving wire area. The plurality of wires may include a scan clock signal wire for transmitting a scan clock signal, and a sensing clock signal wire for transmitting a sensing clock signal. The scan clock signal wire and the sensing clock signal wire may not overlap the organic structure in a plan view.

The plurality of wires may further include a carry clock signal wire for transmitting a carry clock signal, and a global clock signal wire for transmitting a global clock signal. The carry clock signal wire and the global clock signal wire may overlap the organic structure in a plan view.

The driving circuit area may be disposed adjacent to the display area, the sealing area may be disposed adjacent to an edge of the display device, and the driving wire area may be disposed between the driving circuit area and the sealing area.

The display device may further include an encapsulation layer disposed on the plurality of light-emitting devices and the organic structure. The driving wire area may include a first area, a second area, a third area, and a fourth area, the encapsulation layer may be disposed in the display area, the driving circuit area, and the third area and the fourth area of the driving wire area, and the organic structure may be disposed in the second area and the fourth area of the driving wire area.

The organic structure may include a support disposed in the second area, and a dam disposed in the fourth area.

The organic structure may not be disposed in the first area and the third area of the driving wire area.

At least one of the scan clock signal wire and the sensing clock signal wire may be disposed in one of the first area and the third area.

At least one of the carry clock signal wire and the global clock signal wire may be disposed in one of the second area and the fourth area.

The sensing clock signal wire may be disposed in the first area, the global clock signal wire may be disposed in the second area, the scan clock signal wire may be disposed in the third area, and the carry clock signal wire may be disposed in the fourth area.

The scan clock signal wire may be disposed in the first area, the global clock signal wire may be disposed in the second area, the sensing clock signal wire may be disposed in the third area, and the carry clock signal wire may be disposed in the fourth area.

The sensing clock signal wire may be disposed in the first area, the carry clock signal wire may be disposed in the second area, the scan clock signal wire may be disposed in the third area, and the global clock signal wire may be disposed in the fourth area.

The scan clock signal wire may be disposed in the first area, the carry clock signal wire may be disposed in the second area, the sensing clock signal wire may be disposed in the third area, and the global clock signal wire may be disposed in the fourth area.

The encapsulation layer may be disposed in a partial area of the second area of the driving wire area.

The encapsulation layer may include a first inorganic encapsulation layer, an organic encapsulation layer, and a second inorganic encapsulation layer, the first inorganic encapsulation layer, the organic encapsulation layer and the second inorganic encapsulation layer may be sequentially stacked in the display area, the driving circuit area, and a partial area of the fourth area, the organic encapsulation layer may not be disposed in the third area, and the second inorganic encapsulation layer may be disposed on the first inorganic encapsulation layer in the third area.

The display device may further include a color conversion panel facing the display panel, a sealing member disposed in the sealing area between the display panel and the color conversion panel, and a dummy spacer overlapping the sealing member in a plan view.

The color conversion panel may include a second substrate, a first color filter, a second color filter, and a third color filter disposed on a side of the second substrate, a first color converting layer overlapping the first color filter in a plan view, a second color converting layer overlapping the second color filter; a transmission layer overlapping the third color filter in a plan view, a bank disposed between at least two of the first color converting layer, the second color converting layer, and the transmission layer, and a spacer disposed on the bank. The dummy spacer and the spacer may be disposed on a same layer.

The display device may further include a transistor disposed on the first substrate in the display area and electrically connected to the plurality of light-emitting devices. At least some of the plurality of wires and at least a part of the transistor may be disposed on a same layer.

Each of the plurality of wires may include a lower wire and an upper wire electrically connected to each other, and an insulating layer may be disposed between the lower wire and the upper wire and may include a plurality of openings to electrically connect the upper wire and the lower wire.

The transistor may include an oxide semiconductor, a gate electrode overlapping the oxide semiconductor in a plan view, and a first electrode and a second electrode electrically connected to the oxide semiconductor, and the upper wire of each of the plurality of wires, the first electrode, and the second electrode may be disposed on a same layer.

The display device may further include a light blocking layer disposed between the first substrate and the oxide semiconductor. The lower wire of each of the plurality of wires and the light blocking layer may be disposed on a same layer.

According to the embodiments, the signals applied to the respective wires may be prevented from being distorted by permeated moisture entered into the display device.

DETAILED DESCRIPTION OF THE EMBODIMENTS

Figure 1:
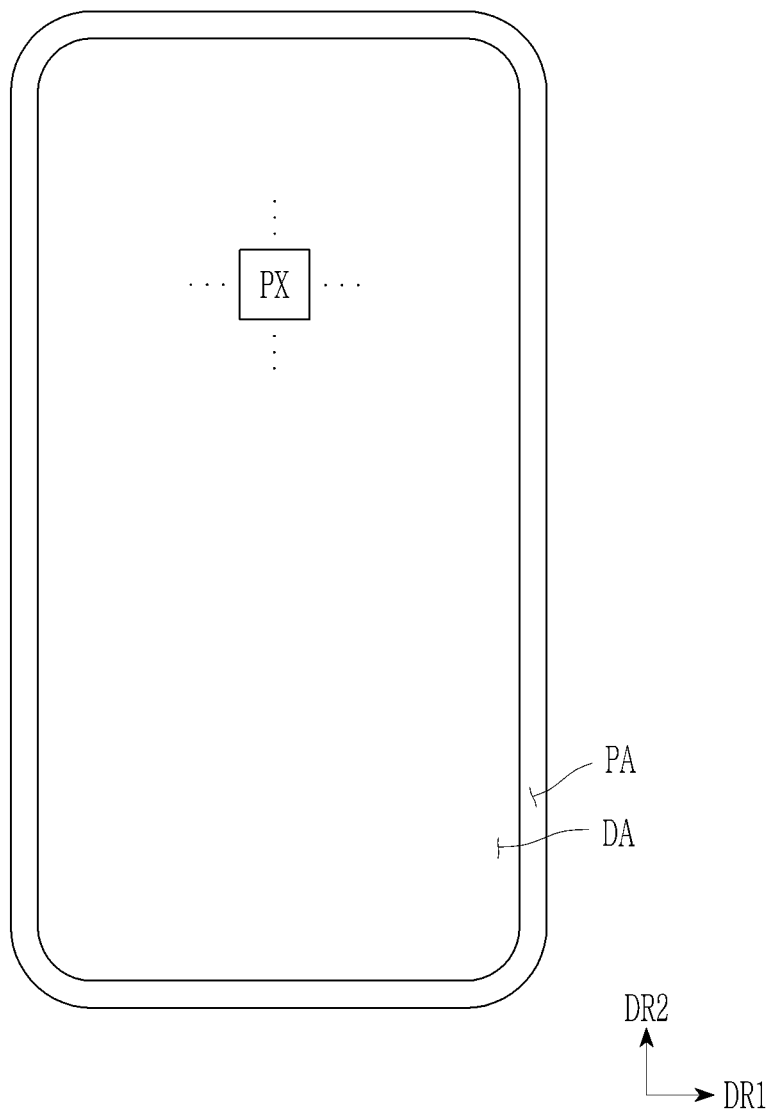
FIG. 1 shows a top plan view of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

Parts that are irrelevant to the description will be omitted to clearly describe the embodiments, and the same elements will be designated by the same reference numerals throughout the specification.

The size and thickness of each configuration shown in the drawings are arbitrarily shown for better understanding and ease of description, but the disclosure is not limited thereto. The thicknesses of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A display device according to an embodiment will now be described with reference to FIG. 1 to FIG. 5.

Figure 2:
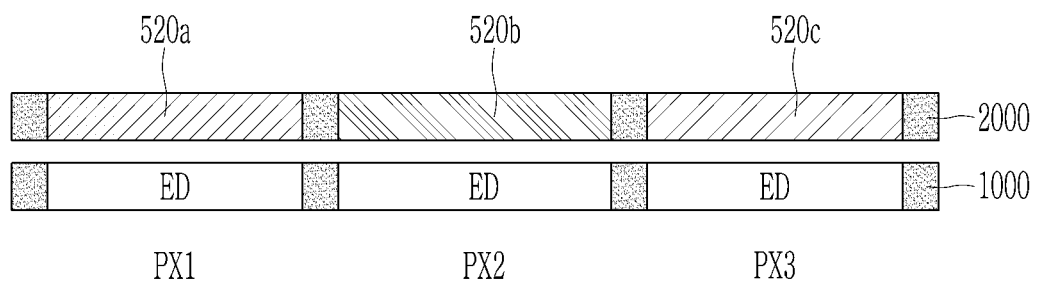
FIG. 2 shows a schematic cross-sectional view of a region of a display device according to an embodiment.
Figure 3:
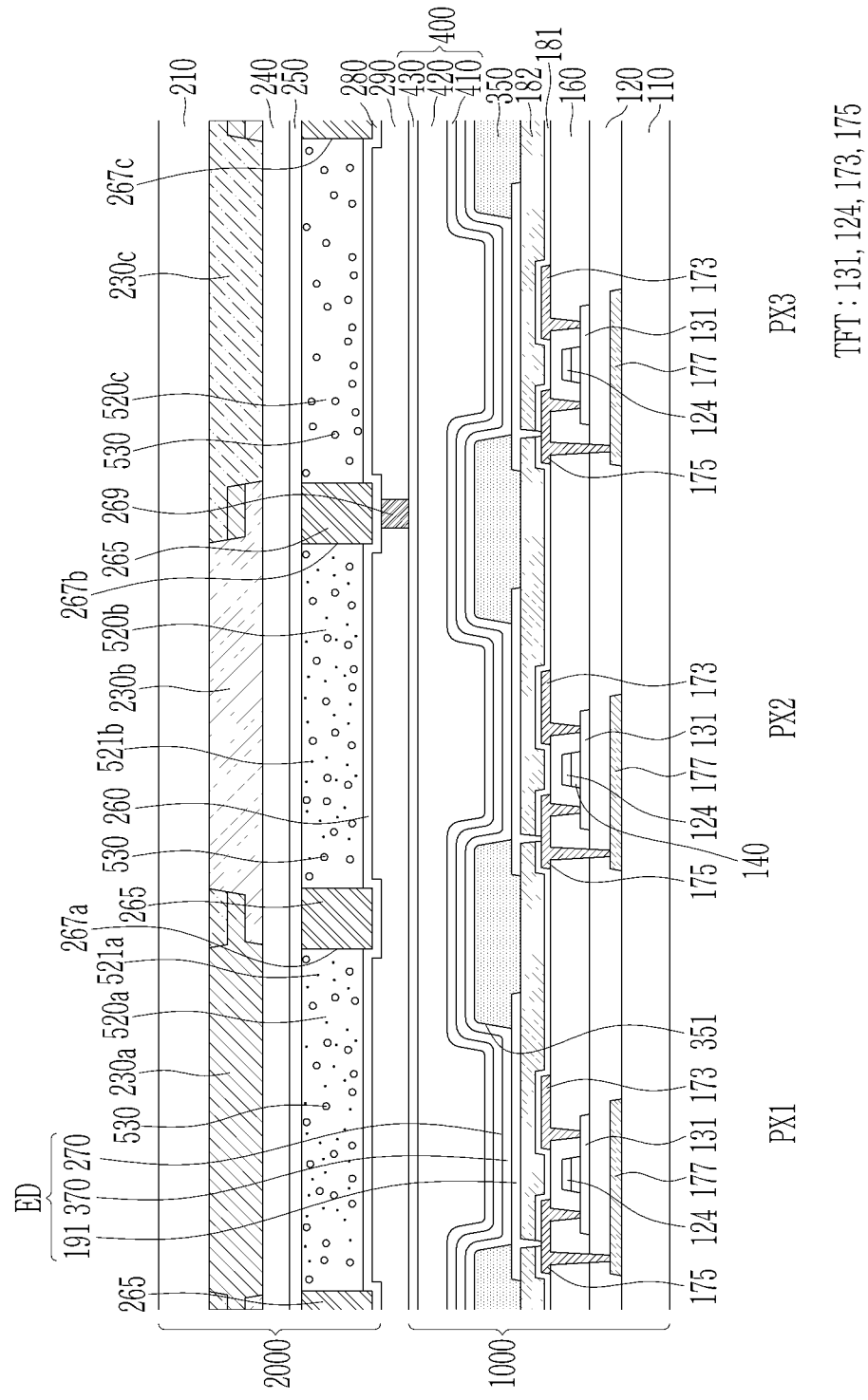
FIG. 3 shows a schematic cross-sectional view of a display area of a display device according to an embodiment.
Figure 4:
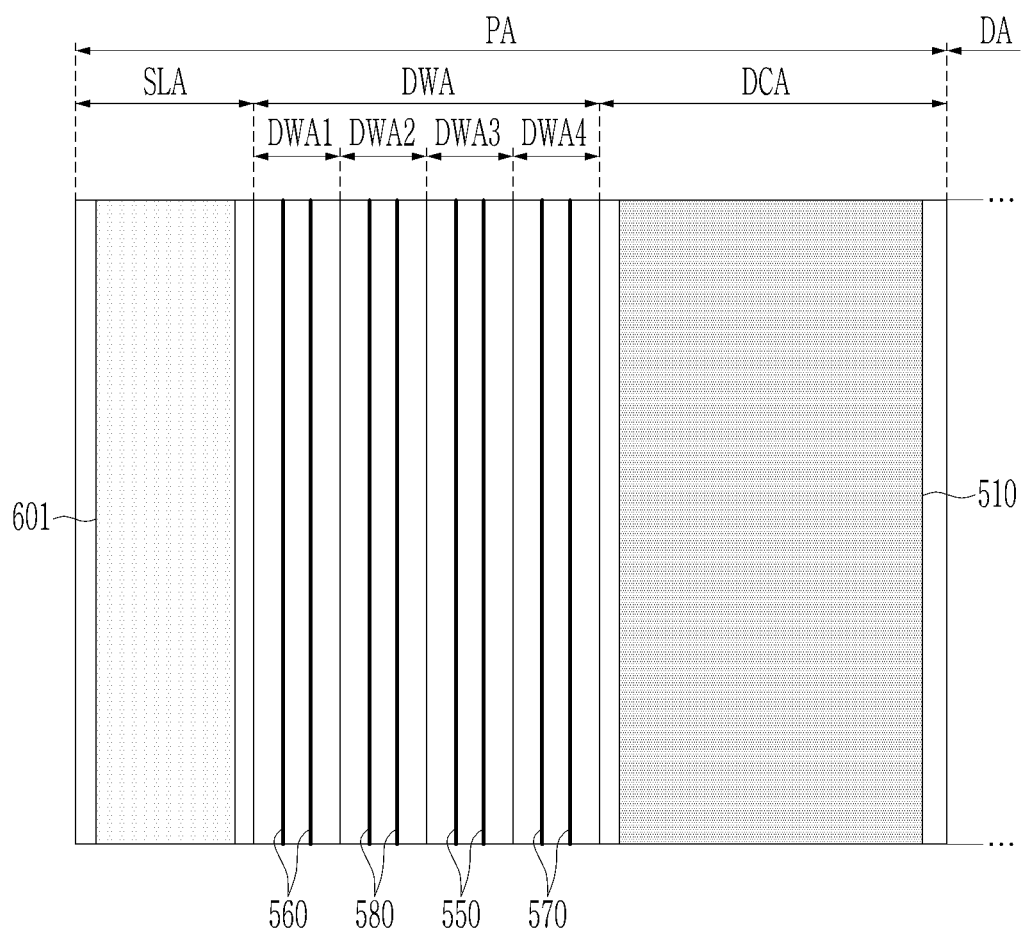
FIG. 4 shows a top plan view of a peripheral area of a display device according to an embodiment.
Figure 5:
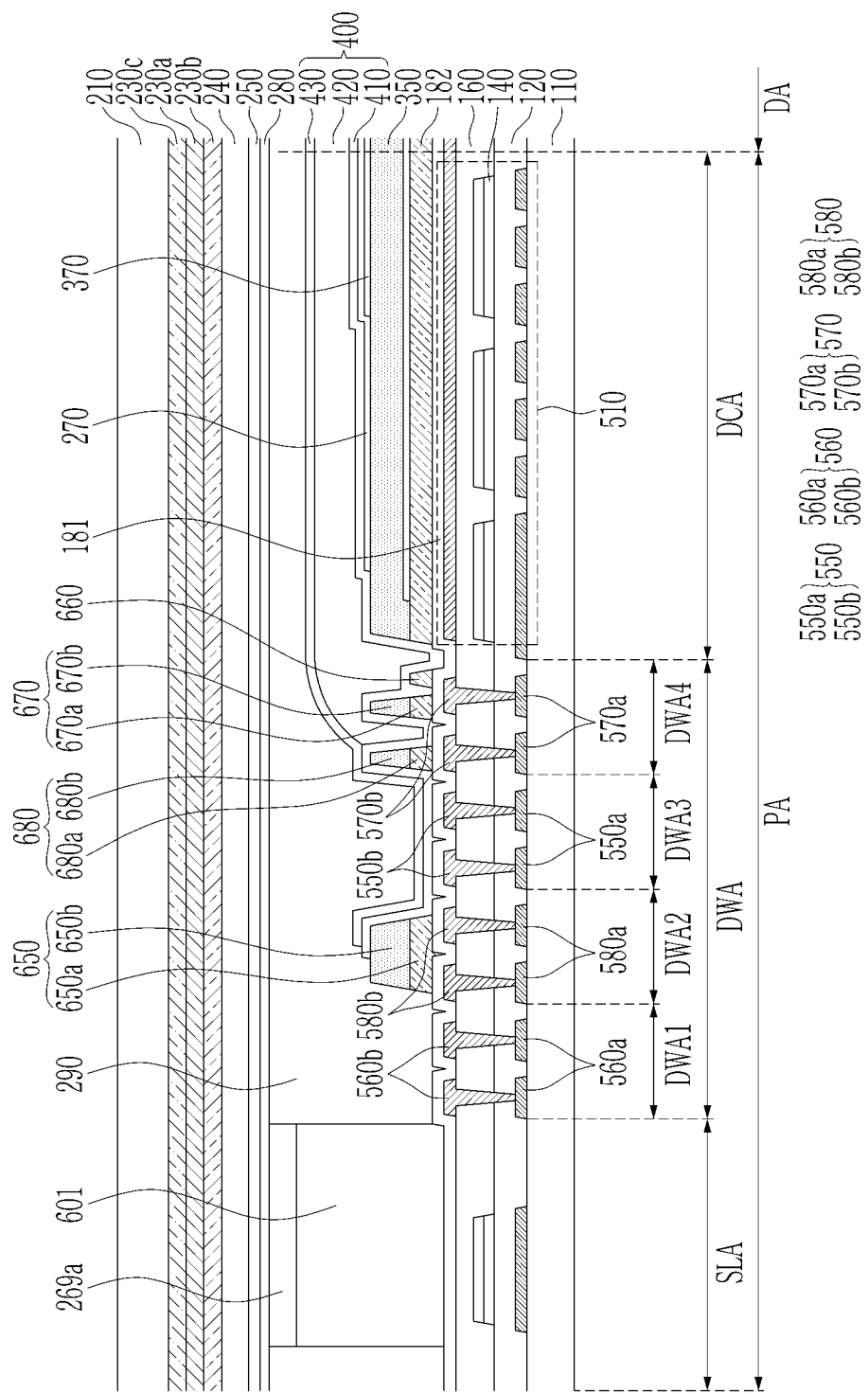
FIG. 5 shows a schematic cross-sectional view of a peripheral area of a display device according to an embodiment.

FIG. 1 shows a top plan view of a display device according to an embodiment, FIG. 2 shows a schematic cross-sectional view of a region of a display device according to an embodiment, and FIG. 3 shows a schematic cross-sectional view of a display area of a display device according to an embodiment. FIG. 4 shows a top plan view of a peripheral area of a display device according to an embodiment, and FIG. 5 shows a schematic cross-sectional view of a peripheral area of a display device according to an embodiment. FIG. 2 and FIG. 3 illustrate a display area of the display device according to an embodiment, and FIG. 4 and FIG. 5 illustrate a peripheral area of the display device according to an embodiment.

As shown in FIG. 1, the display device according to an embodiment may include a display area DA and a peripheral area PA.

Multiple pixels PX may be positioned in the display area DA. The pixels PX may be disposed as a matrix, and may receive image signals and may display images. Arrangement of the pixels PX may be variable in many ways. Although not shown, the display device according to an embodiment may include multiple signal lines. The signal lines may include multiple scan lines, multiple sensing lines, multiple data lines, and multiple driving voltage lines. The signal lines may transmit scan signals, sensing signals, data signals, and driving voltages. The signal lines may be positioned to cross each other in a first direction DR1 or a second direction DR2. The first direction DR1 may be a row direction, and the second direction DR2 may be a column direction. The respective pixels PX may include multiple transistors, capacitors, and at least one light emitting diode ED electrically connected to multiple signal lines. For example, the display device according to an embodiment may be configured with an organic light emitting device. The type of the display device is not limited thereto, and the display device may be configured with other types of display devices. For example, the display device may be formed with a liquid crystal display, an electrophoretic display, or an electrowetting display device. The display device may also be formed with next-generation display devices such as a micro light emitting diode (LED) (Micro LED) display device, a quantum dot light emitting diode (QLED) display device, or a quantum dot organic light emitting diode (QD-OLED) display device.

A circuit unit for transmitting voltages to the signal lines may be positioned in the peripheral area PA. For example, a gate driver for supplying scan signals to the scan line and supplying sensing signals to the sensing line may be positioned. Multiple wires for applying clock signals may be electrically connected to the gate driver. The wires may include a scan clock signal wire, a sensing clock signal wire, a carry clock signal wire, and a global clock signal wire. The gate driver may be positioned on an edge of a side or edges on respective sides of the display device according to an embodiment. The wires electrically connected to the gate driver may be positioned on the edge of a side or edges on respective sides of the display device according to an embodiment. The gate driver may be positioned between at least some of the wires and the display area DA. For example, at least some of the wires may be farther from the display area DA than the gate driver.

As shown in FIG. 2, the display device according to an embodiment may include a display panel 1000 and a color conversion panel 2000 overlapping each other.

The display panel 1000 may include a first pixel PX1, a second pixel PX2, and a third pixel PX3. One first pixel PX1, one second pixel PX2, and one third pixel PX3 are shown in FIG. 2, but the disclosure is not limited thereto, and the display panel 1000 may include multiple first pixels PX1, multiple second pixels PX2, and multiple third pixels PX3. Light-emitting devices ED may be positioned in the first pixels PX1, the second pixels PX2, and the third pixels PX3. For example, the display panel 1000 may include multiple light-emitting devices ED. The light-emitting devices ED may emit light, and the display panel 1000 may adjust light emitted by the light-emitting devices ED of the first pixels PX1, the second pixels PX2, and the third pixels PX3 to display an image. The light-emitting devices ED may be formed as organic light emitting elements, and the display panel 1000 may be formed as an organic light emitting panel. However, the type of the display panel 1000 is not limited thereto, and may be configured with other types of display panels. The display panel 1000 may be a flat and rigid display panel, or may be flexible display panel that may be smoothly bent.

The color conversion panel 2000 may be disposed to face the display panel 1000. The color conversion panel 2000 may include a first color converting layer 520*a*, a second color converting layer 520*b*, and a transmission layer 520*c*. The first color converting layer 520*a* may overlap the light-emitting device ED positioned on the first pixel PX1. Light emitted by the light-emitting device ED of the first pixel PX1 may pass through the first color converting layer 520*a*, and light with a first wavelength may be discharged. The second color converting layer 520*b* may overlap the light-emitting device ED positioned on the second pixel PX2. Light emitted by the light-emitting device ED of the second pixel PX2 may pass through the second color converting layer 520*b*, and light with a second wavelength may be discharged. The transmission layer 520*c* may overlap the light-emitting device ED positioned on the third pixel PX3. Light emitted by the light-emitting device ED of the third pixel PX3 may pass through the transmission layer 520*c*, and light with a third wavelength may be discharged. For example, light with the first wavelength may be red light, light with the second wavelength may be green light, and light with the third wavelength may be blue light. For example, the first pixel PX1, the second pixel PX2, and the third pixel PX3 may respectively be a red pixel, a green pixel, and a blue pixel. Without being limited thereto, colors displayed by the first pixel PX1, the second pixel PX2, and the third pixel PX3 may be variable in many ways. Pixels for displaying other colors may be further included in addition to the first pixel PX1, the second pixel PX2, and the third pixel PX3.

As shown in FIG. 3, the display device according to an embodiment may include a display panel 1000 and a color conversion panel 2000 overlapping each other. A filling layer 290 may be positioned between the display panel 1000 and the color conversion panel 2000.

A stacking structure of the display panel 1000 in the display area DA of the display device according to an embodiment will now be described.

The display panel 1000 may include a first substrate 110, a transistor TFT positioned on one side of the first substrate 110, and a light-emitting device ED electrically connected to the transistor TFT. The transistor TFT may include a semiconductor 131, a gate electrode 124, a first electrode 173, and a second electrode 175. The light-emitting device ED may include a pixel electrode 191, an emission layer 370, and a common electrode 270. The transistor TFT and the light-emitting device ED may be positioned on one side of the first substrate 110 of the display panel 1000 facing the second substrate 210 of the color conversion panel 2000.

The first substrate 110 may include a material with a rigid characteristic such as glass or a flexible material such as plastic or polyimide. The first substrate 110 may be flexible, stretchable, foldable, bendable, or rollable.

A light blocking layer 177 may be positioned on the first substrate 110. The light blocking layer 177 may block the light to the semiconductor 131. The light blocking layer 177 may overlap the semiconductor 131, and may have a greater width than the semiconductor 131.

A buffer layer 120 may be positioned on the light blocking layer 177. The buffer layer 120 may smooth a surface on the first substrate 110, and may block permeation of impurities into the semiconductor 131. The buffer layer 120 may include an inorganic material, for example, an inorganic insulating material such as a silicon nitride ($SiN_x$), a silicon oxide ($SiO_x$), or a silicon oxynitride ($SiO_xN_y$). The buffer layer 120 may have a single-layered or multi-layered structure.

A semiconductor 131 may be positioned on the buffer layer 120. The semiconductor 131 may include at least one of amorphous silicon, polycrystalline silicon, and an oxide semiconductor. For example, the semiconductor 131 may include a low temperature polycrystalline silicon (LTPS) or may include at least one oxide semiconductor material such as zinc (Zn), indium (In), gallium (Ga), tin (Sn), and a mixture thereof. For example, the semiconductor 131 may include an indium-gallium-zinc oxide (IGZO). The semiconductor 131 may include a channel region, a first region, and a second region distinguished by impurities doped thereto. The first region and the second region may have conductive characteristics.

A gate insulating layer 140 may be positioned on the semiconductor 131. The gate insulating layer 140 may cover the semiconductor 131. The gate insulating layer 140 may overlap the channel of the semiconductor 131, and may not overlap the first region or the second region of the semiconductor 131. However, the disclosure is not limited thereto, the gate insulating layer 140 may overlap the entire semiconductor 131, or may be formed on the entire substrate 110. The gate insulating layer 140 may include an inorganic insulating material such as a silicon nitride ($SiN_x$), a silicon oxide ($SiO_x$), or a silicon oxynitride ($SiO_xN_y$). The gate insulating layer 140 may have a single-layered or multi-layered structure.

The gate electrode 124 may be positioned on the gate insulating layer 140. The gate electrode 124 may include a metal such as copper (Cu), molybdenum (Mo), aluminum (Al), silver (Ag), chromium (Cr), tantalum (Ta), titanium (Ti), or a metal alloy thereof. The gate electrode 124 may have a single layer or a multilayer. A region of the semiconductor 131 overlapping the gate electrode 124 in a plan view may be the channel region.

An interlayer insulating layer 160 may be positioned on the gate electrode 124. The interlayer insulating layer 160 may cover the gate electrode 124, the semiconductor 131, and the buffer layer 120. The interlayer insulating layer 160 may include an inorganic insulating material such as a silicon nitride ($SiN_x$), a silicon oxide ($SiO_x$), or a silicon oxynitride ($SiO_xN_y$). The interlayer insulating layer 160 may have a single-layered or multi-layered structure.

The first electrode 173 and the second electrode 175 may be positioned on the interlayer insulating layer 160. The first electrode 173 and the second electrode 175 may be respectively electrically connected to the first region and the second region of the semiconductor 131 through an opening formed in the interlayer insulating layer 160. The semiconductor 131, the gate electrode 124, the first electrode 173, and the second electrode 175 may constitute one transistor TFT. Depending on embodiments, the transistor TFT may include the first region and the second region of the semiconductor 131 without the first electrode 173 and the second electrode 175. Each transistor TFT is disposed on the first pixel PX1, the second pixel PX2, and the third pixel PX3 in FIG. 3. However, the disclosure is limited thereto, and multiple transistors TFT may be positioned on the respective first pixel PX1, second pixel PX2, and third pixel PX3.

The second electrode 175 may be electrically connected to the light blocking layer 177. A buffer layer 120 and an interlayer insulating layer 160 may be positioned between the light blocking layer 177 and the second electrode 175. The second electrode 175 may be electrically connected to the light blocking layer 177 through an opening formed in the buffer layer 120 and the interlayer insulating layer 160. Therefore, a same voltage may be applied to the light blocking layer 177 and the second electrode 175.

The first electrode 173 and the second electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a metal alloy thereof. The first electrode 173 and the second electrode 175 may be a single layer or a multilayer. The first electrode 173 and the second electrode 175 according to an embodiment may be configured to be a triple layer including an upper layer, an intermediate layer, and a lower layer, and the upper layer and the lower layer may include titanium (Ti) and the intermediate layer may include aluminum (Al).

A first passivation layer 181 may be positioned on the first electrode 173 and the second electrode 175. The first passivation layer 181 may include an inorganic insulating material such as a silicon nitride ($SiN_x$), a silicon oxide ($SiO_x$), or a silicon oxynitride ($SiO_xN_y$). The first passivation layer 181 may be omitted.

A second passivation layer 182 may be positioned on the first passivation layer 181. The second passivation layer 182 may include an organic insulating material. For example, the second passivation layer 182 may include at least one of a polyimide, a polyamide, an acryl resin, benzocyclobutene, and a phenol resin. The second passivation layer 182 may smooth the surface on the first substrate 110 on which the transistor TFT is installed.

The pixel electrode 191 may be positioned on the second passivation layer 182. The pixel electrode 191 may be referred to as an anode, and it may be a single layer including a transparent conductive oxide film or a metal material, or a multilayer including the same. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al).

The first passivation layer 181 and the second passivation layer 182 may include a via hole exposing at least part of the second electrode 175. The second electrode 175 may be physically and electrically connected to the pixel electrode 191 through the via hole of the first passivation layer 181 and the second passivation layer 182. Accordingly, the pixel electrode 191 may receive an output current to be transmitted to the emission layer 370 from the second electrode 175.

A pixel defining layer 350 may be positioned on the pixel electrode 191 and the second passivation layer 182. The pixel defining layer 350 may include a pixel opening 351 overlapping at least part of the pixel electrode 191. The pixel opening 351 may overlap a center portion of the pixel electrode 191 and may not overlap an edge portion of the pixel electrode 191. Hence, the pixel opening 351 may be smaller than the pixel electrode 191. The pixel defining layer 350 may partition a position of a light emitting region so that the emission layer 370 may be positioned on a portion on which an upper side of the pixel electrode 191 is exposed. The pixel defining layer 350 may be positioned on a border between the first pixel PX1, the second pixel PX2, and the third pixel PX3. The pixel defining layer 350 may be an organic insulator including at least one of a polyimide, a polyamide, an acryl resin, benzocyclobutene, and a phenol resin. The pixel defining layer 350 may be formed to be a black pixel define layer (BPDL) including a black pigment.

Multiple pixel openings 351 may have a similar shape to the pixel electrode 191 in a plan view. For example, the pixel opening 351 and the pixel electrode 191 may be polygons in a plan view. Corners of the pixel opening 351 and the pixel electrode 191 may be chamfered. However, the shape of the pixel opening 351 and the shape of the pixel electrode 191 are not limited thereto, and they may be modifiable in different ways.

Multiple pixel electrodes 191 respectively corresponding to the first pixel PX1, the second pixel PX2, and the third pixel PX3 may have different sizes in a plan view. Likewise, the pixel openings 351 respectively corresponding to the first pixel PX1, the second pixel PX2, and the third pixel PX3 may have different sizes in a plan view. For example, the pixel opening 351 and the pixel electrode 191 corresponding to the first pixel PX1 may be bigger than the pixel opening 351 and the pixel electrode 191 corresponding to the second pixel PX2. The pixel opening 351 and the pixel electrode 191 corresponding to the first pixel PX1 may be smaller than or may have similar sizes to the pixel opening 351 and the pixel electrode 191 corresponding to the third pixel PX3. However, the disclosure is not limited thereto, and the respective pixel opening 351 and the pixel electrode 191 may have various sizes.

The emission layer 370 may be positioned in the pixel opening 351 on the pixel defining layer 350. For example, the emission layer 370 may be formed on the entire first substrate 110. The emission layer 370 may be formed by a deposition process using an open mask of which a portion that corresponds to the display area DA is opened. Without being limited thereto, the emission layer 370 may be positioned in the pixel opening 351 partitioned by the pixel defining layer 350. The emission layer 370 may include a low-molecular or high-molecular organic material. The emission layer 370 is shown as a single layer in FIG. 3. However, the disclosure is not limited thereto, and the emission layer 370 may include auxiliary layers such as an electron injection layer, an electron transport layer, a hole transport layer, and a hole injection layer above/below the emission layer 370. The hole injection layer and the hole transport layer may be positioned below the emission layer 370, and the electron transport layer and the electron injection layer may be positioned above the emission layer 370. Additional emission layer may be positioned on the emission layer 370. For example, at least two emission layers 370 may be disposed to be stacked each other. Multiple emission layers of a same color may be stacked each other, or multiple emission layers of different colors may be stacked each other. For example, three blue emission layers may be stacked, and one green emission layer may be stacked on the three blue emission layers.

Although not shown, a spacer may be positioned on the pixel defining layer 350. The spacer may include a same material as the pixel defining layer 350. Without being limited thereto, the spacer may be made of a material different from the material of the pixel defining layer 350. The spacer may be an organic insulator including at least one of a polyimide, a polyamide, an acryl resin, benzocyclobutene, and a phenol resin.

The common electrode 270 may be positioned on the emission layer 370. The common electrodes 270 of the first pixel PX1, the second pixel PX2, and the third pixel PX3 may be electrically connected to each other. The common electrodes 270 may be formed to be connected on an entire area of the first substrate 110. The common electrode 270 may be referred to as a cathode, and may be made of a transparent conductive layer including an indium tin oxide (ITO), an indium zinc oxide (IZO), an indium gallium zinc oxide (IGZO), and/or an indium tin zinc oxide (ITZO). The common electrode 270 may be made of a metal material such as silver (Ag), magnesium (Mg), or a mixture thereof. Thicknesses of the common electrodes 270 may be adjusted to be formed as a transparent conductive layer. The common electrodes 270 may have a semi-transparent characteristic, and it may configure a microcavity with the pixel electrode 191.

The pixel electrode 191, the emission layer 370, and the common electrode 270 may configure a light-emitting device ED. On the first pixel PX1, the second pixel PX2, and the third pixel PX3, portions overlapping the pixel electrode 191, the emission layer 370, and the common electrode 270 may be the light emitting regions of the respective light-emitting devices ED.

An encapsulation layer 400 may be positioned on the common electrode 270. The encapsulation layer 400 may include at least one inorganic film and at least one organic film. In the embodiment, the encapsulation layer 400 may include a first inorganic encapsulation layer 410, an organic encapsulation layer 420, and a second inorganic encapsulation layer 430. However, the disclosure is not limited thereto, and the number of inorganic films and organic films configuring the encapsulation layer 400 may be modifiable in many ways. For example, the encapsulation layer 400 may be stacked in an order of a first inorganic encapsulation layer, a second inorganic encapsulation layer, a first organic encapsulation layer, and a third inorganic encapsulation layer. In another embodiment, the encapsulation layer 400 may be stacked in an order of a first inorganic encapsulation layer, a first organic encapsulation layer, a second inorganic encapsulation layer, and a third inorganic encapsulation layer. The display panel 1000 may include a display area DA for displaying an image and a peripheral area PA adjacent to the display area DA. The first inorganic encapsulation layer 410, the organic encapsulation layer 420, and the second inorganic encapsulation layer 430 may be positioned in part of the display area DA and the peripheral area PA. The organic encapsulation layer 420 may be formed adjacent to the display area DA, and the first inorganic encapsulation layer 410 and the second inorganic encapsulation layer 430 may extend to the peripheral area PA. The encapsulation layer 400 may protect the light-emitting device (ED) from moisture or oxygen that may enter from the outside, and end portions of each of the first inorganic encapsulation layer 410 and the second inorganic encapsulation layer 430 may be formed to directly contact each other.

The encapsulation layer 400 may contact the filling layer 290. The second inorganic encapsulation layer 430 of the encapsulation layer 400 may contact the filling layer 290. However, the disclosure is not limited thereto, and another layer may be positioned between the encapsulation layer 400 and the filling layer 290.

Although not shown, the display device may include a sensor for sensing touches. The sensor may include multiple sensing electrodes, and the sensor may be positioned between the display panel 1000 and the color conversion panel 2000. Without being limited thereto, the sensor may be positioned on the color conversion panel 2000.

A stacking structure of the color conversion panel 2000 in the display area DA of the display device according to an embodiment will now be described.

The color conversion panel 2000 may include a second substrate 210, and a first color filter 230a, a second color filter 230b, and a third color filter 230c positioned on a lateral side of the second substrate 210.

The second substrate 210 may include a rigid material such as glass, or a flexible material such as plastic or a polyimide, that may be bent. The second substrate 210 may be flexible, stretchable, foldable, bendable, or rollable.

The first color filter 230a may transmit light with a first wavelength and may absorb light with other wavelengths so it may increase purity of light with a first wavelength discharged to an outside of the display device.

The second color filter 230b may transmit light with a second wavelength and may absorb light with other wavelengths so it may increase purity of light with a second wavelength discharged to the outside of the display device.

The third color filter 230c may transmit light with a third wavelength and may absorb light with other wavelengths so it may increase purity of light with a third wavelength discharged to the outside of the display device.

The first color filter 230a, the second color filter 230b, and the third color filter 230c may respectively overlap the first pixel PX1, the second pixel PX2, and the third pixel PX3. The first color filter 230a, the second color filter 230b, and the third color filter 230c may overlap each other and may form a light blocking region on the boundary between the first pixel PX1, the second pixel PX2, and the third pixel PX3. The first color filter 230a, the second color filter 230b, and the third color filter 230c are shown to overlap each other in the light blocking region in FIG. 3, but are not limited thereto. For example, two of the first color filter 230a, the second color filter 230b, and the third color filter 230c may overlap each other and may form a light blocking region. For example, the first color filter 230a may overlap the second color filter 230b on the boundary between the first pixel PX1 and the second pixel PX2. The second color filter 230b may overlap the third color filter 230c on the boundary between the second pixel PX2 and the third pixel PX3. The third color filter 230c may overlap the first color filter 230a on the boundary between the third pixel PX3 and the first pixel PX1.

A low-refractive index layer 240 may be positioned on a lateral side of each of the first color filter 230a, the second color filter 230b, and the third color filter 230c. For example, the low refractive index layer 240 may be positioned between the first color filter 230a and the first color converting layer 520a, between the second color filter 230b and the second color converting layer 520b, and between the third color filter 230c and the transmission layer 520c. The position of the low-refractive index layer 240 is not limited thereto and may be modifiable in many ways. For example, a low refractive index layer 240 may be positioned on the first color converting layer 520a, the second color converting layer 520b, and the transmission layer 520c. In another embodiment, the low refractive index layer 240 may include multiple layers, some thereof may be positioned between the first color filter 230a and the first color converting layer 520a, between the second color filter 230b and the second color converting layer 520b, and between the third color filter 230c and the transmission layer 520c, and the others thereof may be positioned on the first color converting layer 520a, the second color converting layer 520b, and the transmission layer 520c. The low refractive index layer 240 may overlap the first color filter 230a, the second color filter 230b, and the third color filter 230c. For example, the low refractive index layer 240 may be positioned on the second substrate 210. The low refractive index layer 240 may include an organic material or an inorganic material with a low refractive index. For example, the refractive index of the low refractive index layer 240 may be equal to or greater than about 1.1 and may be equal to or less than about 1.3.

A first capping layer 250 may be positioned on the low refractive index layer 240. The first capping layer 250 may protect the low refractive index layer 240, and may include an inorganic insulating material such as a silicon nitride ($SiN_x$), a silicon oxide ($SiO_x$), or a silicon oxynitride ($SiO_xN_y$). The first capping layer 250 may have a single-layered or multi-layered structure.

A partition wall or a bank 265 may be positioned on the first capping layer 250. The bank 265 may include a first opening 267a overlapping the first color filter 230a, a second opening 267b overlapping the second color filter 230b, and a third opening 267c overlapping the third color filter 230c. The first opening 267a may overlap the light emitting region of the first pixel PX1, the second opening 267b may overlap the light emitting region of the second pixel PX2, and the third opening 267c may overlap the light emitting region of the third pixel PX3. The bank 265 may overlap a light blocking region in which at least two of the first color filter 230a, the second color filter 230b, and the third color filter 230c overlap each other. Hence, the bank 265 may overlap the boundary between the pixels PX1, PX2, and PX3. The bank 265 may overlap the pixel defining layer 350. The pixel defining layer 350 may overlap a light blocking region in which at least two of the first color filter 230a, the second color filter 230b, and the third color filter 230c overlap each other.

The first color converting layer 520a may be positioned in the first opening 267a, the second color converting layer 520b may be positioned in the second opening 267b, and the transmission layer 520c may be positioned in the third opening 267c. The first color converting layer 520a, the second color converting layer 520b, and the transmission layer 520c may be surrounded by the bank 265.

The first color converting layer 520a may overlap the first color filter 230a. The first color converting layer 520a may not overlap the second color filter 230b or the third color filter 230c. The first color converting layer 520a may convert light from the light-emitting device ED of the first pixel PX1 into light with a first wavelength. Light with a first wavelength may have a peak wavelength of about 600 nm to about 650 nm, and for example, it may be red light having a peak wavelength of about 620 nm to about 650 nm. The first color converting layer 520a may include multiple first quantum dots 521a and multiple scatterers 530.

The second color converting layer 520b may overlap the second color filter 230b. The second color converting layer 520b may not overlap the first color filter 230a or the third color filter 230c. The second color converting layer 520b may convert light from the light-emitting device ED of the second pixel PX2 into light with a second wavelength. Light with a second wavelength may have a peak wavelength of about 500 nm to about 550 nm, and for example, it may be green light having a peak wavelength of about 510 nm to about 550 nm. The second color converting layer 520b may include multiple second quantum dots 521b and the scatterers 530.

The transmission layer 520c may overlap the third color filter 230c. The transmission layer 520c may not overlap the first color filter 230a or the second color filter 230b. The transmission layer 520c may transmit light from the light-emitting device ED of the third pixel PX3. The light having passed through the transmission layer 520c may be light with a third wavelength. The light with a third wavelength may be blue light having a peak wavelength of about 380 nm to about 480 nm, for example, equal to or greater than about 420 nm, equal to or greater than about 430 nm, equal to or greater than about 440 nm, or equal to or greater than about 445 nm, and equal to or less than about 470 nm, equal to or less than about 460 nm, or equal to or less than about 455 nm. The transmission layer 520c may include the scatterers 530.

The scatterers 530 may scatter light in the first color converting layer 520a, the second color converting layer 520b, and the transmission layer 520c and may improve light efficiency.

The first quantum dot 521a and the second quantum dot 521b (hereinafter, semiconductor nanocrystals) may respectively include a group II-VI compound, a group III-V compound, a group IV-VI compound, a group IV element or compound, a group compound, a group compound, a group I-II-IV-VI compound, or a combination thereof. The quantum dots may not include cadmium.

The group II-VI compound may include a binary element compound selected from the group consisting of CdSe, CdTe, ZnS, ZnSe, ZnTe, ZnO, HgS, HgSe, HgTe, MgSe, MgS, and a mixture thereof; a ternary element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group II-VI compound may include a group III metal.

The group III-V compound may include a binary element compound selected from the group consisting of GaN, GaP, GaAs, GaSb, AlN, AlP, AlAs, AlSb, InN, InP, InAs, InSb, and a mixture thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may include a group II metal (e.g., InZnP).

The group IV-VI compound may include a binary element compound selected from the group consisting of SnS, SnSe, SnTe, PbS, PbSe, PbTe, and a mixture thereof; a ternary element compound selected from the group consisting of SnSeS, SnSeTe, SnSTe, PbSeS, PbSeTe, PbSTe, SnPbS, SnPbSe, SnPbTe, and a mixture thereof; and a quaternary element compound selected from the group consisting of SnPbSSe, SnPbSeTe, SnPbSTe, and a mixture thereof.

The group IV element or compound may include a singular element material selected from the group consisting of Si, Ge, and a mixture thereof, and a binary element compound selected from the group consisting of SiC, SiGe, and a mixture thereof, but are not limited thereto.

The group compound may include $CuInSe_2$, $CuInS_2$, CuInGaSe, and CuInGaS, but are not limited thereto. The group I-II-IV-VI compound may include CuZnSnSe and CuZnSnS, but are not limited thereto. The group IV element or compound may include a single element selected from the group consisting of Si, Ge, and a mixture thereof, or a binary compound selected from the group consisting of SiC, SiGe, and a mixture thereof.

The group compound may include a compound selected from the group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but are not limited thereto.

The group I-II-IV-VI compound may include a compound selected from the group consisting of CuZnSnSe and CuZnSnS, but is not limited thereto.

In an embodiment, the quantum dots may not include cadmium. The quantum dots may include semiconductor nanocrystals including the group III-V compound such as indium and phosphorus. The group III-V compound may include zinc. The quantum dots may include a semiconductor nanocrystal including the group II-VI compound such as a chalcogen (e.g., sulfur, selenium, tellurium, or a combination thereof) and zinc.

Regarding the quantum dot, the above-described binary compound, the ternary compound, and/or the quaternary compound may exist in the particles with uniform concentration, or may exist in the same particles with a concentration distribution partially divided into some states. Further, the quantum dot may have a core/shell structure where one quantum dot surrounds another quantum dot. An interface between the core and the shell may have a concentration gradient such that a concentration of an element existing in the shell is gradually reduced toward the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may have a single layer or a multilayer. An interface between the core and the shell may have a concentration gradient such that a concentration of an element existing in the shell is gradually reduced toward the center thereof. The shell of the quantum dot may include a metallic or non-metallic oxide, a semiconductor compound, or a combination thereof.

For example, the metallic or non-metallic oxide may include binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$, or ternary compounds such as $MgAl_2O_4$, $CoFe_2O_4$, $NiFe_2O_4$, or $CoMn_2O_4$, but the disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the disclosure is not limited thereto.

An interface between the core and the shell may have a concentration gradient such that a concentration of an element existing in the shell is gradually reduced toward the center thereof. The semiconductor nanocrystal may have a structure including one semiconductor nanocrystal core and a multi-layered shell surrounding the semiconductor nanocrystal core. In an embodiment, the multi-layered shell may have two or more layers, for example, two, three, four, five, or more layers. The two adjacent layers of the shell may have a single composition or different compositions. In the multi-layered shell, each layer may have a composition that varies along the radius.

The quantum dots may have a full width at half maximum (FWHM) of a light-emitting wavelength spectrum that is less than about 45 nm, less than about 40 nm, or less than about 30 nm, and it may improve color purity or color reproducibility within this range. Further, light emitted through the quantum dot may output in all directions, thereby improving a light viewing angle.

Regarding the quantum dots, a shell material and a core material may have different energy bandgaps. For example, an energy bandgap of the shell material may be greater than that of the core material. In another embodiment, an energy bandgap of the shell material may be less than that of the core material. The quantum dots may have a multi-layered shell. Regarding the multi-layered shell, an energy bandgap of an outer layer may be greater than an energy bandgap of an inner layer (i.e., a layer that is near the core). Regarding the multi-layered shell, an energy bandgap of the outer layer may be less than an energy bandgap of the inner layer.

The quantum dots may adjust the absorption/emission wavelength by adjusting the composition and the size thereof. A peak wavelength of light the quantum dots emit may have a wavelength range from ultraviolet to infrared or higher.

The quantum dots may include an organic ligand (e.g., having a hydrophobic residue and/or a hydrophilic residue). The organic ligand residue may be bonded to the surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, and here, R may independently be a $C_3$ to $C_{40}$ substituted or unsubstituted aliphatic hydrocarbon group such as a $C_3$ to $C_{40}$ (e.g., $C_5$ to $C_{24}$) substituted or unsubstituted alkyl group, or a substituted or unsubstituted alkenyl group, a $C_6$ to $C_{40}$ (e.g., $C_6$ to $C_{20}$) substituted or unsubstituted aromatic hydrocarbon group such as a $C_6$ to $C_{40}$ substituted or unsubstituted aryl group, or a combination thereof.

The organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octyl phosphine, dioctyl phosphine, tributyl phosphine, or trioctyl phosphine; phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide; diphenyl phosphine, or a triphenyl phosphine compound or oxide compounds thereof; $C_5$ to $C_{20}$ alkyl phosphinic acids such as hexyl phosphinic acid, octyl phosphinic acid, dodecane phosphinic acid, tetradecane phosphinic acid, hexadecane phosphinic acid, or octadecane phosphinic acid; and $C_5$ to $C_{20}$ alkyl phosphonic acids. The quantum dot may include a hydrophobic organic ligand or as a mixture of more than one kind. The hydrophobic organic ligand may not include a photopolymerizable residue (e.g., acrylate or methacrylate).

A second capping layer 280 may be positioned on the first color converting layer 520a, the second color converting layer 520b, the transmission layer 520c, and the bank 265. The second capping layer 280 may be positioned on the second substrate 210. The second capping layer 280 may cover the first color converting layer 520a, the second color converting layer 520b, and the transmission layer 520c and may protect the same, and may be made of an inorganic material. For example, the second capping layer 280 may include an inorganic insulating material such as a silicon nitride ($SiN_x$), a silicon oxide ($SiO_x$), or a silicon oxynitride ($SiO_xN_y$). The second capping layer 280 may have a single-layered or multi-layered structure.

A spacer 269 may be positioned on the second capping layer 280. The spacer 269 may overlap the bank 265. The spacer 269 may be made of a material same or different from the material of the bank 265. The spacer 269 may include a light blocking material. For example, the spacer 269 may include a black pigment.

The display panel 1000 may be bonded to the color conversion panel 2000, and a filling layer 290 may be positioned between the display panel 1000 and the color conversion panel 2000. The filling layer 290 may be positioned on an entire area in a plan view.

As shown in FIG. 4, the peripheral area PA may be positioned on an outside of the display area DA of the display device according to an embodiment. The peripheral area PA of the display device may include a driving circuit area DCA, a driving wire area DWA, and a sealing area SLA.

The driving circuit area DCA may be positioned adjacent to the display area DA. A circuit unit for supplying signals for driving multiple pixels positioned in the display area DA may be positioned in the driving circuit area DCA. For example, the gate driver 510 for supplying gate driving signals may be positioned in the driving circuit area DCA. The gate driving signals may include a scan signal and a sensing signal. The gate driver 510 and the pixels positioned in the display area DA may be electrically connected to each other by a scan signal line and a sensing signal line. The scan signal line may transmit the scan signal, and the sensing signal line may transmit the sensing signal.

The driving wire area DWA may be positioned adjacent to the driving circuit area DCA. The driving circuit area DCA may be positioned between the driving wire area DWA and the display area DA. Multiple wires 550, 560, 570, and 580 for applying clock signals to the gate driver 510 may be positioned in the driving wire area DWA. The wires 550, 560, 570, and 580 may include a scan clock signal wire 550, a sensing clock signal wire 560, a carry clock signal wire 570, and a global clock signal wire 580. The scan clock signal wire 550 may transmit a scan clock signal to the gate driver 510, and the sensing clock signal wire 560 may transmit a sensing clock signal to the gate driver 510. The carry clock signal wire 570 may transmit a carry clock signal to the gate driver 510, and the global clock signal wire 580 may transmit a global clock signal to the gate driver 510.

The driving wire area DWA may include a first area DWA1, a second area DWA2, a third area DWA3, and a fourth area DWA4 that are sequentially disposed. In the driving wire area DWA, the first area DWA1 may be the farthest from the display area DA, and may be positioned nearest the edge of the display device. In the driving wire area DWA, the fourth area DWA4 may be positioned the nearest the display area DA, and may be the farthest from the edge of the display device. In the embodiment, the sensing clock signal wire 560 may be positioned in the first area DWA1, the global clock signal wire 580 may be positioned in the second area DWA2, the scan clock signal wire 550 may be positioned in the third area DWA3, and the carry clock signal wire 570 may be positioned in the fourth area DWA4. However, the disclosure is not limited thereto, and the positions of the scan clock signal wire 550, the sensing clock signal wire 560, the carry clock signal wire 570, and the global clock signal wire 580 may be modifiable in many ways.

The sealing area SLA may be positioned adjacent to the edge of the display device. The sealing area SLA may be positioned adjacent to the driving wire area DWA. The driving wire area DWA may be positioned between the sealing area SLA and the driving circuit area DCA. The first area DWA1 of the driving wire area DWA may be positioned adjacent to the sealing area SLA, and the fourth area DWA4 of the driving wire area DWA may be positioned adjacent to the driving circuit area DCA. A sealing member 601 may be positioned in the sealing area SLA.

As shown in FIG. 5, the display panel 1000 may overlap the color conversion panel 2000 in the peripheral area PA of the display device according to an embodiment similar to the display area DA. The display panel 1000 and the color conversion panel 2000 may be disposed to face each other, and the filling layer 290 and the sealing member 601 may be positioned between the display panel 1000 and the color conversion panel 2000.

A stacking structure of the display panel 1000 in the peripheral area PA of the display device according to an embodiment will now be described.

The display panel 1000 may include a first substrate 110, and multiple wires 550, 560, 570, and 580 and a gate driver 510 positioned on the first substrate 110. The wires 550, 560, 570, and 580 may include a scan clock signal wire 550, a sensing clock signal wire 560, a carry clock signal wire 570, and a global clock signal wire 580.

A lower scan clock signal wire 550*a*, a lower sensing clock signal wire 560*a*, a lower carry clock signal wire 570*a*, and a lower global clock signal wire 580*a* may be positioned on the first substrate 110. The lower scan clock signal wire 550*a*, the lower sensing clock signal wire 560*a*, the lower carry clock signal wire 570*a*, and the lower global clock signal wire 580*a* may be positioned on a same layer as the light blocking layer 177 positioned in the display area DA. The lower scan clock signal wire 550*a*, the lower sensing clock signal wire 560*a*, the lower carry clock signal wire 570*a*, and the lower global clock signal wire 580*a* may be formed by a same process as the light blocking layer 177, and may include a same material.

The lower scan clock signal wire 550*a*, the lower sensing clock signal wire 560*a*, the lower carry clock signal wire 570*a*, and the lower global clock signal wire 580*a* may be positioned in the driving wire area DWA. The driving wire area DWA may include a first area DWA1, a second area DWA2, a third area DWA3, and a fourth area DWA4. The lower sensing clock signal wire 560*a* may be positioned in the first area DWA1, the lower global clock signal wire 580*a* may be positioned in the second area DWA2, the lower scan clock signal wire 550*a* may be positioned in the third area DWA3, and the lower carry clock signal wire 570*a* may be positioned in the fourth area DWA4. However, the disclosure is not limited thereto, and the positions of the lower scan clock signal wire 550*a*, the lower sensing clock signal wire 560*a*, the lower carry clock signal wire 570*a*, and the lower global clock signal wire 580*a* may be modifiable in many ways.

A buffer layer 120 may be positioned on the lower scan clock signal wire 550*a*, the lower sensing clock signal wire 560*a*, the lower carry clock signal wire 570*a*, and the lower global clock signal wire 580*a*. A gate insulating layer 140 and an interlayer insulating layer 160 may be stacked on the buffer layer 120. The buffer layer 120 and the interlayer insulating layer 160 may be positioned on the entire peripheral area PA.

An upper scan clock signal wire 550*b*, an upper sensing clock signal wire 560*b*, an upper carry clock signal wire 570*b*, and an upper global clock signal wire 580*b* may be positioned on the interlayer insulating layer 160. The upper scan clock signal wire 550*b*, the upper sensing clock signal wire 560*b*, the upper carry clock signal wire 570*b*, and the upper global clock signal wire 580*b* may be positioned on the same layer as the first electrode 173 and the second electrode 175 positioned in the display area DA. The upper scan clock signal wire 550*b*, the upper sensing clock signal wire 560*b*, the upper carry clock signal wire 570*b*, and the upper global clock signal wire 580*b* may be formed by a same process as the first electrode 173 and the second electrode 175, and may include a same material.

The upper scan clock signal wire 550*b*, the upper sensing clock signal wire 560*b*, the upper carry clock signal wire 570*b*, and the upper global clock signal wire 580*b* may be positioned in the driving wire area DWA. The upper sensing clock signal wire 560*b* may be positioned in the first area DWA1, the upper global clock signal wire 580*b* may be positioned in the second area DWA2, the upper scan clock signal wire 550*b* may be positioned in the third area DWA3, and the upper carry clock signal wire 570*b* may be positioned in the fourth area DWA4. However, the disclosure is not limited thereto, and the positions of the upper scan clock signal wire 550*b*, the upper sensing clock signal wire 560*b*, the upper carry clock signal wire 570*b*, and the upper global clock signal wire 580*b* may be modifiable in many ways.

The upper scan clock signal wire 550*b* may overlap the lower scan clock signal wire 550*a*. A buffer layer 120 and an interlayer insulating layer 160 may be positioned between the lower scan clock signal wire 550*a* and the upper scan clock signal wire 550*b*. An opening may be made in the buffer layer 120 and the interlayer insulating layer 160. The upper scan clock signal wire 550*b* may be electrically connected to the lower scan clock signal wire 550*a* through the opening. The lower scan clock signal wire 550*a* and the upper scan clock signal wire 550*b* may configure a scan clock signal wire 550. Two scan clock signal wires 550 are shown to be positioned in the third area DWA3 in FIG. 5. However, the disclosure is not limited thereto, and a number of the scan clock signal wires 550 may be modifiable in many ways. For example, six scan clock signal wires 550 may be positioned in the third area DWA3.

The upper sensing clock signal wire 560*b* may overlap the lower sensing clock signal wire 560*a*. The buffer layer 120 and the interlayer insulating layer 160 may be positioned between the lower sensing clock signal wire 560a and the upper sensing clock signal wire 560b. An opening may be formed in the buffer layer 120 and the interlayer insulating layer 160. The upper sensing clock signal wire 560b may be electrically connected to the lower sensing clock signal wire 560a through the opening. The lower sensing clock signal wire 560a and the upper sensing clock signal wire 560b may configure the sensing clock signal wire 560. Two sensing clock signal wires 560 are shown to be positioned in the first area DWA1 in FIG. 5. However, the disclosure is not limited thereto, and the number of the sensing clock signal wires 560 may be modifiable in many ways. For example, six sensing clock signal wires 560 may be positioned in the first area DWA1.

The upper carry clock signal wire 570b may overlap the lower carry clock signal wire 570a. The buffer layer 120 and the interlayer insulating layer 160 may be positioned between the lower carry clock signal wire 570a and the upper carry clock signal wire 570b. An opening may be formed in the buffer layer 120 and the interlayer insulating layer 160. The upper carry clock signal wire 570b may be electrically connected to the lower carry clock signal wire 570a through the opening. The lower carry clock signal wire 570a and the upper carry clock signal wire 570b may configure the carry clock signal wire 570. Two carry clock signal wires 570 are shown to be positioned in the fourth area DWA4 in FIG. 5. However, the disclosure is not limited thereto, and the number of the carry clock signal wires 570 may be modifiable in many ways. For example, six carry clock signal wires 570 may be positioned in the fourth area DWA4.

The upper global clock signal wire 580b may overlap the lower global clock signal wire 580a. The buffer layer 120 and the interlayer insulating layer 160 may be positioned between the lower global clock signal wire 580a and the upper global clock signal wire 580b. An opening may be formed in the buffer layer 120 and the interlayer insulating layer 160. The upper global clock signal wire 580b may be electrically connected to the lower global clock signal wire 580a through the opening. The lower global clock signal wire 580a and the upper global clock signal wire 580b may configure the global clock signal wire 580. Two global clock signal wires 580 are shown to be positioned in the second area DWA2 in FIG. 5. However, the disclosure is not limited thereto, and the number of the global clock signal wires 580 may be modifiable in many ways. For example, six global clock signal wires 580 may be positioned in the second area DWA2.

The gate driver 510 may receive signals from the scan clock signal wire 550, the sensing clock signal wire 560, the carry clock signal wire 570, and the global clock signal wire 580, may generate a scan signal and a sensing signal, and may transmit the same to the respective pixels positioned in the display area DA. The gate driver 510 may include multiple transistors, and the respective transistors may include metal layers positioned on the same layer as the light blocking layer 177, the gate electrode 124, the first electrode 173, and the second electrode 175.

A first passivation layer 181 may be positioned on the upper scan clock signal wire 550b, the upper sensing clock signal wire 560b, the upper carry clock signal wire 570b, the upper global clock signal wire 580b, and the gate driver 510. The first passivation layer 181 may be positioned in the entire peripheral area PA.

The second passivation layer 182 and the pixel defining layer 350 may be positioned on the first passivation layer 181. The second passivation layer 182 and the pixel defining layer 350 may be positioned in the driving circuit area DCA.

An emission layer 370 may be positioned on the pixel defining layer 350. The emission layer 370 may be positioned in most of the area of the display area DA, and may be positioned in a partial region of the peripheral area PA. An end portion of the emission layer 370 may be positioned in the driving circuit area DCA. The emission layer 370 may be formed by performing a deposition process using an open mask, and an edge of the open portion of the open mask may correspond to the driving circuit area DCA.

A common electrode 270 may be positioned on the emission layer 370. The common electrode 270 may be formed to cover the upper side and the lateral side of the emission layer 370. The common electrode 270 may be positioned in most of the region of the display area DA, and may be positioned in a partial region of the peripheral area PA. An end portion of the common electrode 270 may be positioned in the driving circuit area DCA. The common electrode 270 may be formed by performing a deposition process using an open mask, and an edge of the open portion of the open mask may correspond to the driving circuit area DCA. A size of the open portion of the open mask for forming the common electrode 270 may be relatively greater than a size of the open portion of the open mask for forming the emission layer 370. Therefore, the end portion of the common electrode 270 may be farther from the display area DA than the end portion of the emission layer 370 is.

A support 650 and dams 660, 670, and 680 may be positioned on the first passivation layer 181. The support 650 and the dams 660, 670, and 680 may be positioned in the driving wire area DWA. The support 650 and the dams 660, 670, and 680 may be positioned to be spaced from each other. The support 650 may be farther from the display area DA than the dams 660, 670, and 680. The support 650 and the dams 660, 670, and 680 may be made of an organic insulating material.

The support 650 may be positioned in the second area DWA2 of the driving wire area DWA. The support 650 may overlap the global clock signal wire 580. The support 650 may include a lower support 650a and an upper support 650b. The upper support 650b may be positioned on the lower support 650a. The lower support 650a may be positioned on the same layer as the second passivation layer 182. The lower support 650a may be made by a same process as the second passivation layer 182, and may include a same material. The upper support 650b may be positioned on the same layer as the pixel defining layer 350. The upper support 650b may be made by a same process as the pixel defining layer 350, and may include a same material.

The emission layer 370, the common electrode 270, the first inorganic encapsulation layer 410, and the second inorganic encapsulation layer 430 may be made by performing a deposition process using an open mask. The support 650 may support the open mask.

The dams 660, 670, and 680 may be positioned in the fourth area DWA4 of the driving wire area DWA. The dams 660, 670, and 680 may overlap the carry clock signal wire 570. The dams 660, 670, and 680 may include a first dam 660, a second dam 670, and a third dam 680. The first dam 660, the second dam 670, and the third dam 680 may be spaced from each other. The embodiment includes three dams, but the disclosure is not limited thereto, and the number of the dams may be modifiable in many ways.

The first dam 660 may be positioned on the edge of the fourth area DWA4, and may be positioned adjacent to the driving circuit area DCA. The first dam 660 may be positioned on the same layer as the second passivation layer 182. The first dam 660 may be made by a same process as the second passivation layer 182, and may include a same material.

The second dam 670 may be positioned in a center portion of the fourth area DWA4, and may be positioned between the first dam 660 and the third dam 680. The second dam 670 may include a lower second dam 670a and an upper second dam 670b. The upper second dam 670b may be positioned on the lower second dam 670a. The lower second dam 670a may be positioned on the same layer as the second passivation layer 182. The lower second dam 670a may be made by a same process as the second passivation layer 182, and may include a same material. The upper second dam 670b may be positioned on the same layer as the pixel defining layer 350. The upper second dam 670b may be made by a same process as the pixel defining layer 350, and may include a same material.

The third dam 680 may be positioned on the edge of the fourth area DWA4, and may be positioned adjacent to the third area DWA3. The third dam 680 may include a lower third dam 680a and an upper third dam 680b. The upper third dam 680b may be positioned on the lower third dam 680a. The lower third dam 680a may be positioned on the same layer as the second passivation layer 182. The lower third dam 680a may be made by a same process as the second passivation layer 182, and may include a same material. The upper third dam 680b may be positioned on the same layer as the pixel defining layer 350. The upper third dam 680b may be made by a same process as the pixel defining layer 350, and may include a same material.

Organic structures such as the support 650 or the dams 660, 670, and 680 may be positioned in the second area DWA2 and the fourth area DWA4 of the driving wire area DWA. Therefore, the organic structures may be positioned on the carry clock signal wire 570 and the global clock signal wire 580. A layer made of an organic insulating material may not be positioned in the first area DWA1 and the third area DWA3 of the driving wire area DWA. Hence, no organic structure may be positioned on the scan clock signal wire 550 and the sensing clock signal wire 560.

An encapsulation layer 400 may be positioned on the pixel defining layer 350, the common electrode 270, and the dams 660, 670, and 680. The encapsulation layer 400 may include a first inorganic encapsulation layer 410, an organic encapsulation layer 420, and a second inorganic encapsulation layer 430. The organic encapsulation layer 420 may be positioned between the first inorganic encapsulation layer 410 and the second inorganic encapsulation layer 430 in the driving circuit area DCA and a partial region of the fourth area DWA4 of the driving wire area DWA. The organic encapsulation layer 420 may not be positioned in the second area DWA2 and the third area DWA3 of the driving wire area DWA. The second inorganic encapsulation layer 430 may be positioned on the first inorganic encapsulation layer 410 in the second area DWA2 and the third area DWA3 of the driving wire area DWA. The organic encapsulation layer 420 may be positioned in an entire area of the display area DA, and it may be positioned from the boundary between the display area DA and the peripheral area PA to the portion on which the dams 660, 670, and 680 are formed in the peripheral area PA. Therefore, the organic encapsulation layer 420 may be positioned in the driving circuit area DCA and a partial region of the fourth area DWA4 of the driving wire area DWA. The first inorganic encapsulation layer 410 and the second inorganic encapsulation layer 430 may be positioned in an entire area of the display area DA, and may be positioned from the boundary between the display area DA and the peripheral area PA to the portion on which the support 650 is formed in the peripheral area PA. Therefore, the first inorganic encapsulation layer 410 and the second inorganic encapsulation layer 430 may be positioned in the driving circuit area DCA and the third area DWA3 and the fourth area DWA4 of the driving wire area DWA. The first inorganic encapsulation layer 410 and the second inorganic encapsulation layer 430 may be also positioned in a partial region of the second area DWA2 of the driving wire area DWA. The first inorganic encapsulation layer 410 and the second inorganic encapsulation layer 430 may be not positioned in the first area DWA1 of the driving wire area DWA and may be not positioned in another partial region of the second area DWA2. In another embodiment, the first inorganic encapsulation layer 410 and the second inorganic encapsulation layer 420 may not be positioned in the second area DWA2.

A stacking structure of the color conversion panel 2000 in the peripheral area PA of the display device according to an embodiment will now be described.

The color conversion panel 2000 may include a second substrate 210, and a first color filter 230a, a second color filter 230b, and a third color filter 230c positioned on a side of the second substrate 210.

The first color filter 230a, the second color filter 230b, and the third color filter 230c may overlap each other in the peripheral area PA. The first color filter 230a, the second color filter 230b, and the third color filter 230c may be positioned in the peripheral area PA. The third color filter 230c may be positioned on a side of the second substrate 210, the first color filter 230a may be positioned on the third color filter 230c, and the second color filter 230b may be positioned on the first color filter 230a. Therefore, the second color filter 230b may be positioned between the first color filter 230a and the third color filter 230c. A stacking order of the first color filter 230a, the second color filter 230b, and the third color filter 230c is not limited thereto, and the order may be modifiable in many ways. The first color filter 230a, the second color filter 230b, and the third color filter 230c may overlap each other to block light in the peripheral area PA. Two of the first color filter 230a, the second color filter 230b, and the third color filter 230c may overlap each other in the peripheral area PA.

A low refractive index layer 240 may be positioned on a side of the first color filter 230a, the second color filter 230b, and the third color filter 230c. The low refractive index layer 240 may be positioned in the peripheral area PA.

The first capping layer 250 may be positioned on a side of the low refractive index layer 240, and the second capping layer 280 may be positioned on the first capping layer 250. The first capping layer 250 and the second capping layer 280 may be entirely positioned in the peripheral area PA.

The display panel 1000 may be bonded to the color conversion panel 2000, and a filling layer 290 and a sealing member 601 may be positioned between the display panel 1000 and the color conversion panel 2000.

The filling layer 290 may be positioned in an entire area in a plan view. When a filling layer forming material is applied between the display panel 1000 and the color conversion panel 2000 and a bonding process is performed in the process for forming the filling layer 290, the filling layer forming material may be spread to the edge of the display device. Therefore, the filling layer 290 may be positioned in the entire region of the display device. The filling layer 290 may not overlap the sealing member 601.

The filling layer 290 may be positioned in the driving circuit area DCA and the driving wire area DWA in the peripheral area PA.

The sealing member 601 may be positioned in the sealing area SLA of the peripheral area PA. The sealing member 601 may surround the display area DA in a plan view. Therefore, elements positioned in the display area DA may be surrounded and sealed by the sealing member 601. The display panel 1000 and the color conversion panel 2000 may be bonded and fixed by the sealing member 601. The sealing member 601 may be formed by applying a sealing member forming material to an outer edge of the peripheral area PA between the first substrate 110 and the second substrate 210, irradiating UV rays, and performing a curing process.

A dummy spacer 269a may be positioned between the display panel 1000 and the color conversion panel 2000. The dummy spacer 269a may be positioned in the sealing area SLA, and may overlap the sealing member 601. The dummy spacer 269a may be positioned on the same layer as the spacer 269. The dummy spacer 269a may be simultaneously formed in a same process as the spacer 269, and may include a same material as the spacer 269. The dummy spacer 269a may include a light blocking material. For example, the dummy spacer 269a may include a black pigment.

When the process for bonding the display panel 1000 and the color conversion panel 2000 is performed, a pressure may be applied, and a thickness difference between a portion on which the filling layer 290 is positioned and a portion on which the filling layer 290 is not positioned may be generated. For example, a distance between the display panel 1000 and the color conversion panel 2000 in the driving wire area DWA in which the filling layer 290 is positioned may be relatively greater than a distance between the display panel 1000 and the color conversion panel 2000 in the sealing area SLA in which the filling layer 290 is not positioned. Hence, there may be differences of restoration forces for respective areas, and the gap between the display panel 1000 and the color conversion panel 2000 may be increased.

Regarding the display device according to an embodiment, a dummy spacer 269a may be positioned so that it may overlap the sealing member 601 between the display panel 1000 and the color conversion panel 2000, and hence, the difference of thicknesses between the portion on which the filling layer 290 is positioned and the portion on which the filling layer 290 is not positioned may be reduced. Hence, the differences of restoration forces for respective regions may be reduced, and the gap between the display panel 1000 and the color conversion panel 2000 may be prevented from increasing.

Moisture or impurities may enter through an interface between the dummy spacer 269a and the sealing member 601 in a high-temperature and high-moisture condition. Because of this, capacitance between the wires 550, 560, 570, and 580 positioned in the driving wire area DWA may be increased, and defects may be generated. Some of the wires 550, 560, 570, and 580 may have a signal delay relatively more influenced by permeation of moisture, and the others thereof may be relatively less influenced by the same.

Regarding the display device according to an embodiment, the wires 550, 560, 570, and 580 may be arranged by considering degrees of influences of permeation of moisture on a signal delay, thereby preventing generation of defects. The scan clock signal wire 550 and the sensing clock signal wire 560 may be relatively weak against permeation of moisture, and the carry clock signal wire 570 and the global clock signal wire 580 may be relatively robust against permeation of moisture. Particularly, the scan clock signal wire 550 may be weaker against the permeation of moisture than the sensing clock signal wire 560. The global clock signal wire 580 may be more robust against the permeation of moisture than the carry clock signal wire 570.

The driving wire area DWA may include a first area DWA1, a second area DWA2, a third area DWA3, and a fourth area DWA4. The organic structures such as the support 650 and the dams 660, 670, and 680 may cause permeation of moisture so the second area DWA2 and fourth area DWA4 in which the organic structure is positioned may be relatively weak against permeation of moisture. The first area DWA1 and the third area DWA3 in which the organic structure is not positioned may be relatively robust against permeation of moisture. The first inorganic encapsulation layer 410 and the second inorganic encapsulation layer 420 may prevent permeation of moisture so the third area DWA3 and the fourth area DWA4 in which the first inorganic encapsulation layer 410 and the second inorganic encapsulation layer 420 are positioned may be relatively robust against permeation of moisture. The first area DWA1 in which the first inorganic encapsulation layer 410 and the second inorganic encapsulation layer 420 are not positioned or the second area DWA2 in which they are partially positioned may be relatively weak against permeation of moisture.

The third area DWA3 in which the organic structure is not positioned and the inorganic encapsulation layers 410 and 420 are positioned may be the most robust against the permeation of moisture. The scan clock signal wire 550 that is the weakest against the permeation of moisture may be disposed in the third area DWA3 that is the most robust against the permeation of moisture.

The first area DWA1 in which the organic structure is not positioned and the inorganic encapsulation layers 410 and 420 are not positioned may be considered to be the second most robust against the permeation of moisture. The sensing clock signal wire 560 that is the second weakest against the permeation of moisture may be disposed in the first area DWA1 that is the second most robust against the permeation of moisture.

The fourth area DWA4 in which the organic structure is positioned and the inorganic encapsulation layers 410 and 420 are positioned may be considered to be the third most robust against the permeation of moisture, and may be slightly weak against the permeation of moisture. The carry clock signal wire 570 that is slightly robust against the permeation of moisture may be disposed in the fourth area DWA4 that is slightly weak against the permeation of moisture.

The second area DWA2 in which the organic structure is positioned and the inorganic encapsulation layers 410 and 420 are not positioned or are partly positioned may be considered to be the fourth most robust against the permeation of moisture, signifying that it is the weakest against the permeation of moisture. The global clock signal wire 580 that is the most robust against permeation of moisture may be disposed in the second area DWA2 that is the weakest against permeation of moisture.

For example, regarding the display device according to an embodiment, the wires 550, 560, 570, and 580 may be arranged by considering the robustness degrees against the permeation of moisture of the wires 550, 560, 570, and 580 and the robustness degrees against the permeation of moisture of the first to fourth areas DWA1, DWA2, DWA3, and DWA4 in the driving wire area DWA, thereby reducing the influence of the permeation of moisture. The wires that are weak against the permeation of moisture may be disposed in the regions that are relatively robust against the permeation of moisture, and the wires that are robust against the permeation of moisture may be disposed in the regions that are relatively weak against the permeation of moisture. By this, generation of defects may be prevented in case that the moisture is permeated from the outside.

One transistor is shown in the respective pixels in FIG. 3, bur the disclosure is not limited thereto, and multiple transistors may be positioned in the respective pixels. An example of a circuit diagram configuring the respective pixels will now be described with reference to FIG. 6.

Figure 6:
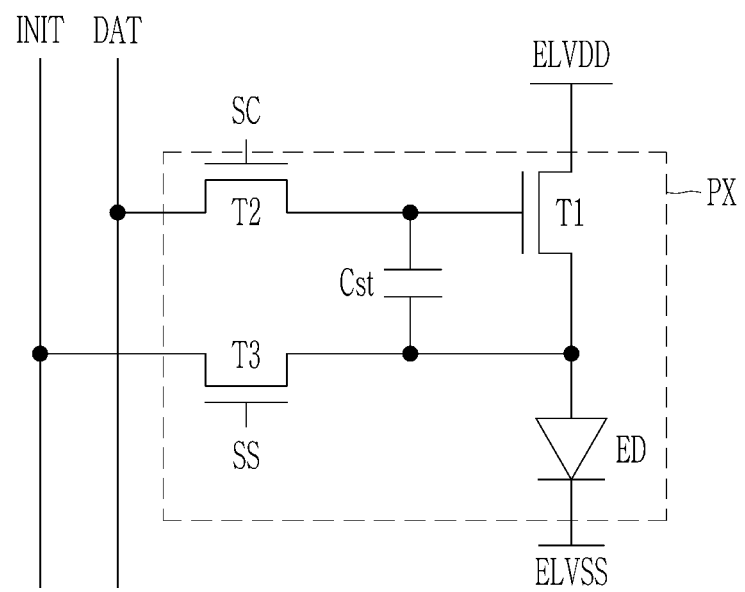
FIG. 6 shows a schematic diagram of and equivalent circuit of a pixel of a display device according to an embodiment.

FIG. 6 shows a schematic diagram of and equivalent circuit of a pixel of a display device according to an embodiment.

As shown in FIG. 6, a pixel PX may include multiple transistors T1, T2, and T3, a capacitor Cst, and a light-emitting device ED. In the embodiment, an embodiment in which one pixel PX includes a light-emitting device ED will be generally described.

The transistors T1, T2, and T3 may include a driving transistor T1, a switching transistor T2, and an initialization transistor T3. A first electrode and a second electrode to be described may distinguish two electrodes positioned on respective sides of channels of the transistors T1, T2, and T3.

A gate electrode of the driving transistor T1 may be electrically connected to a first end of the capacitor Cst, a first electrode of the driving transistor T1 may be electrically connected to a driving voltage line for transmitting a driving voltage (ELVDD), and a second electrode of the driving transistor T1 may be electrically connected to an anode of the light-emitting device ED and a second end of the capacitor Cst. The driving transistor T1 may receive a data voltage DAT in response to a switching operation of the switching transistor T2 and may supply a driving current to the light-emitting device ED according to the voltage stored in the capacitor Cst.

A gate electrode of the switching transistor T2 may be electrically connected to a scan line for transmitting scan signals SC, a first electrode of the switching transistor T2 may be electrically connected to a data line for transmitting the data voltage DAT or a reference voltage, and a second electrode of the switching transistor T2 may be electrically connected to the first end of the capacitor Cst and the gate electrode of the driving transistor T1. The scan line may be electrically connected to the gate driver and may receive the scan signal SC from the gate driver. The switching transistor T2 may be turned on by the scan signal SC and may transmit the reference voltage or the data voltage DAT to the gate electrode of the driving transistor T1 and the first end of the capacitor Cst.

A gate electrode of the initialization transistor T3 may be electrically connected to a sensing line for transmitting sensing signals SS, a first electrode of the initialization transistor T3 may be electrically connected to the second end of the capacitor Cst, the second electrode of the driving transistor T1, and the anode of the light-emitting device ED, and a second electrode of the initialization transistor T3 may be electrically connected to an initialization voltage line for transmitting an initialization voltage INIT. The sensing line may be electrically connected to the gate driver and may receive the sensing signal SS from the gate driver. The initialization transistor T3 may be turned on by the sensing signal SS, may transmit the initialization voltage INIT to the anode of the light-emitting device ED and the second end of the capacitor Cst, and may initialize the voltage.

The first end of the capacitor Cst may be electrically connected to the gate electrode of the driving transistor T1, and a second end thereof may be electrically connected the first electrode of the initialization transistor T3 and the anode of the light-emitting device ED. A cathode of the light-emitting device ED may be electrically connected to a common voltage line for transmitting a common voltage ELVSS.

The light-emitting device ED may emit light with luminance according to the driving current by the driving transistor T1.

An embodiment of an operation of a circuit shown in FIG. 6, particularly an embodiment of an operation for one frame, will now be described. The transistors T1, T2, and T3 may be n-type channel transistors but are not limited thereto.

When one frame starts, the common voltage ELVSS may be applied as a high-level voltage while the scan signal SC and the sensing signal SS are low-level for an initialization section. By this, the light-emitting device ED may be prevented from emitting light by disallowing the current to flow through the light-emitting device ED. Further, the initialization voltage INIT may be applied through the initialization voltage line. The high-level scan signal SC and the high-level sensing signal SS may be supplied to turn on the switching transistor T2 and the initialization transistor T3. The reference voltage from the data line may be supplied to the gate electrode of the driving transistor T1 and the first electrode of the capacitor Cst through the turned-on switching transistor T2, and the initialization voltage INIT may be supplied to the second electrode of the driving transistor T1 and the anode through the turned-on initialization transistor T3. Accordingly, the anode may be initialized with the initialization voltage INIT for the initialization section. A voltage difference between the reference voltage and the initialization voltage INIT may be stored in the capacitor Cst.

For a sensing section, the high-level scan signal SC and the high-level sensing signal SS may be maintained. The initialization voltage line may be disconnected from a supply source of the initialization voltage INIT, and may function as a sensing line. The gate electrode of the driving transistor T1 and the first electrode of the capacitor Cst may maintain the reference voltage through the switching transistor T2. Therefore, when the current flows to the second electrode from the first electrode of the driving transistor T1 and when the voltage at the second electrode becomes (reference voltage-threshold voltage), the driving transistor T1 may be turned off, and the initialization voltage line may be charged up to the (reference voltage-threshold voltage). The threshold voltage may be a threshold voltage of the driving transistor T1. The initialization voltage line charged with the (reference voltage-threshold voltage) may be electrically connected to an external circuit, and the external circuit may receive the threshold voltage of the driving transistor T1 by sensing the voltage at the initialization voltage line. Characteristic deviations of the driving transistor T1 that may be variable by the pixels PX may be compensated by generating the compensated data signal by applying characteristic information sensed for the sensing section.

For a data input section, the high-level scan signal SC may be supplied, the low-level sensing signal SS may be supplied, and the data voltage DAT from the data line may be supplied to the gate electrode of the driving transistor T1 and the first electrode of the capacitor Cst through the turned-on switching transistor T2. The data voltage DAT may have values that are compensated based on sensing of the threshold voltage of the driving transistor T1, and the characteristic deviation of the driving transistor T1 may be corrected by using the values. When the data voltage DAT is applied, the second electrode of the driving transistor T1 and the anode may substantially maintain potentials in the sensing section by the turned-off driving transistor T1.

For a light emitting section, the driving transistor T1 turned on by the data voltage DAT transmitted to the gate electrode of the driving transistor T1 may generate the driving current according to the data voltage DAT, and the light-emitting device ED may emit light by the driving current. For example, luminance of the light-emitting device ED may be adjusted by adjusting the driving current of the light-emitting device ED based on the data voltage DAT applied to the pixel PX.

A display device according to an embodiment will now be described with reference to FIG. 7 and FIG. 8.

Figure 7:
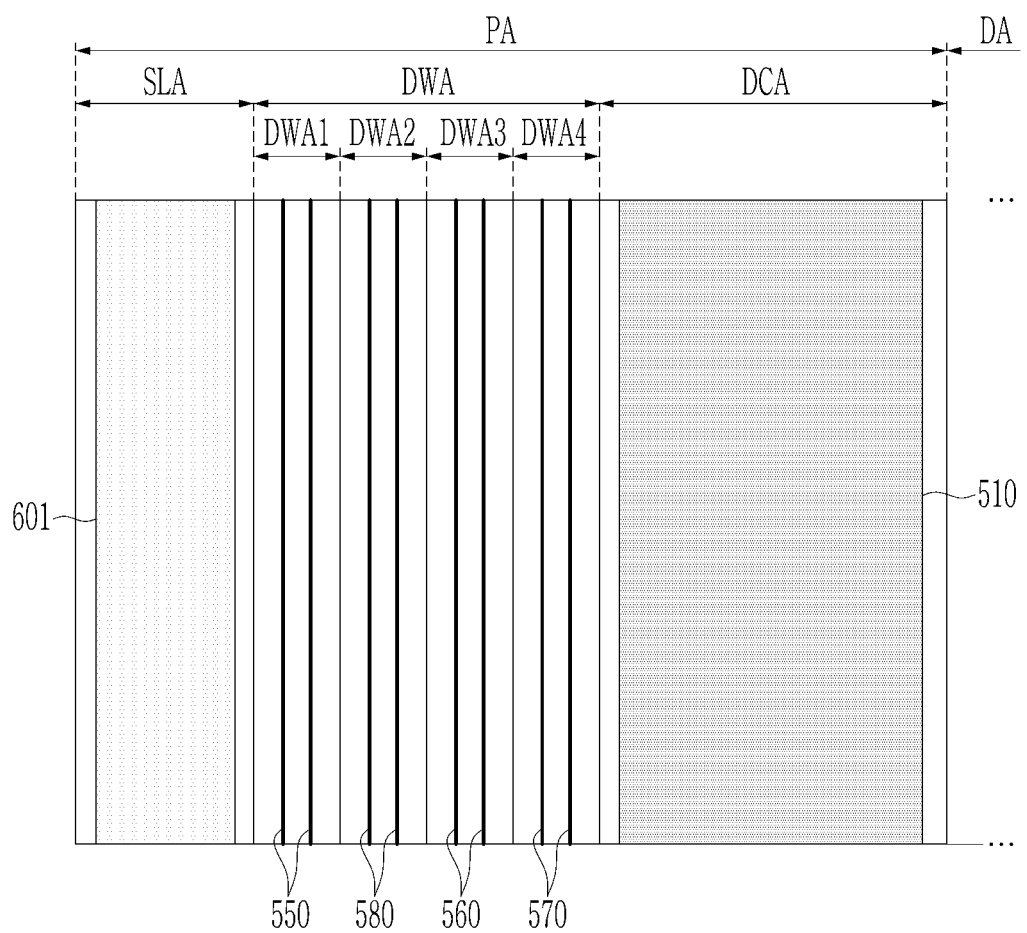
FIG. 7 shows a top plan view of a peripheral area of a display device according to an embodiment.
Figure 8:
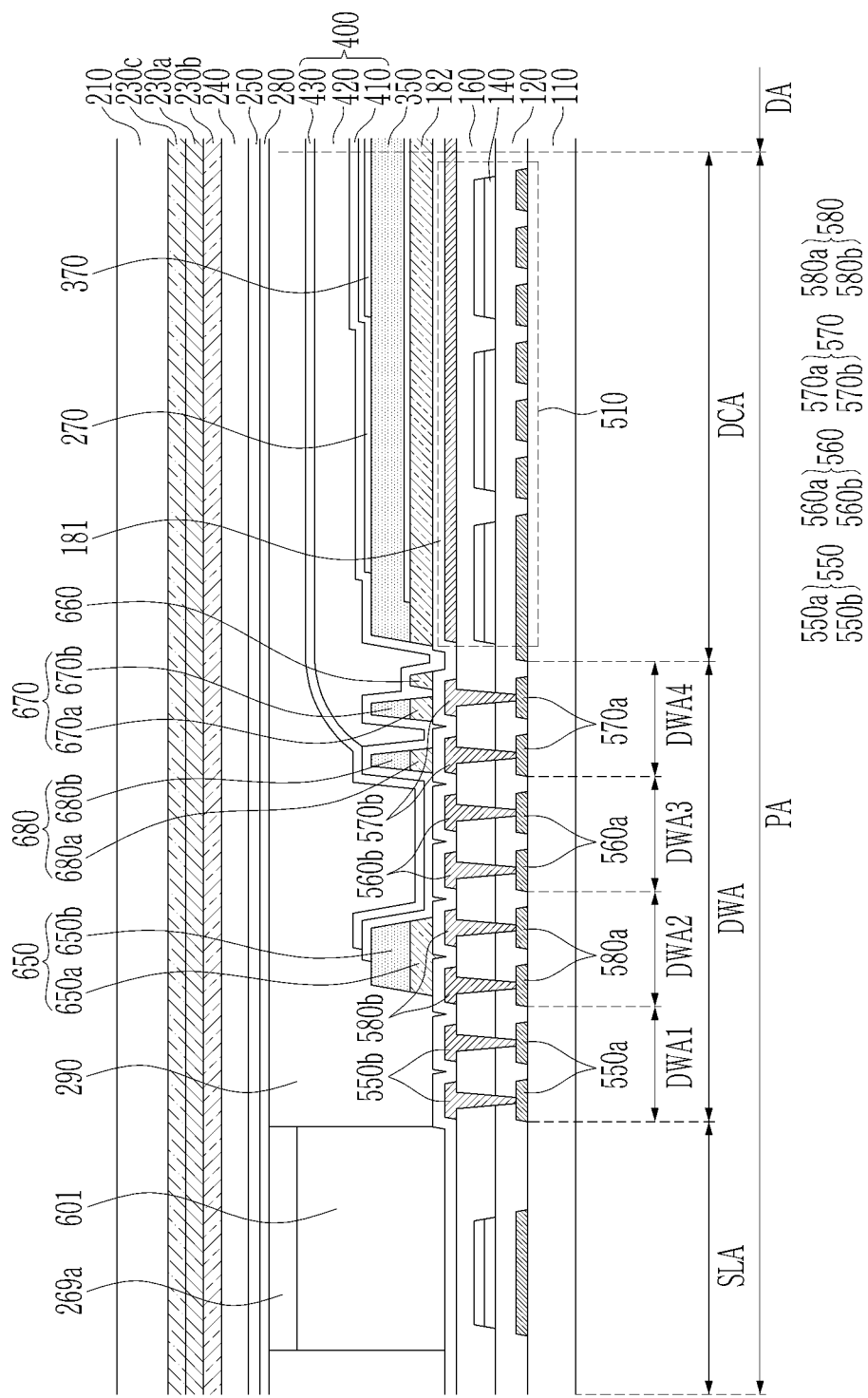
FIG. 8 shows a schematic cross-sectional view of a peripheral area of a display device according to an embodiment.

The display device according to the embodiment shown in FIG. 7 and FIG. 8 is similar to the display device according to the embodiment shown in FIG. 1 to FIG. 5, and no same portion will be described. Arrangement of wires positioned in the driving wire area according to the embodiment is different from that of the embodiment in FIG. 1 to FIG. 5, which will now be described.

FIG. 7 shows a top plan view of a peripheral area of a display device according to an embodiment, and FIG. 8 shows a schematic cross-sectional view of a peripheral area of a display device according to an embodiment.

As shown in FIG. 7 and FIG. 8, the display device according to an embodiment may include a display area DA and a peripheral area PA. The peripheral area PA may include a driving circuit area DCA, a driving wire area DWA, and a sealing area SLA. The driving wire area DWA may include a first area DWA1, a second area DWA2, a third area DWA3, and a fourth area DWA4.

The display device may include a display panel 1000 and a color conversion panel 2000 disposed to face each other, and a filling layer 290 and a sealing member 601 may be positioned between the display panel 1000 and the color conversion panel 2000. The sealing member 601 may be positioned in the sealing area SLA. The display panel 1000 may include a first substrate 110, and multiple wires 550, 560, 570, and 580 and a gate driver 510 positioned on the first substrate 110. The wires 550, 560, 570, and 580 may be positioned in the driving wire area DWA, and the gate driver 510 may be positioned in the driving circuit area DCA.

In the embodiment of FIGS. 4 and 5, the sensing clock signal wire 560 may be positioned in the first area DWA1, and the scan clock signal wire 550 may be positioned in the third area DWA3. In the embodiment of FIGS. 7 and 8, positions of the sensing clock signal wire 560 and the scan clock signal wire 550 may be exchanged. For example, the scan clock signal wire 550 may be positioned in the first area DWA1, and the sensing clock signal wire 560 may be positioned in the third area DWA3. The difference of robustness degrees against the permeation of moisture between the scan clock signal wire 550 and the sensing clock signal wire 560 is not great, and the defects due to permeation of moisture may be prevented in the embodiment similar to the embodiment of FIGS. 4 and 5. For example, the scan clock signal wire 550 and the sensing clock signal wire 560 that are weak against permeation of moisture may be respectively disposed in the first area DWA1 and the third area DWA3 in which the organic structure is not positioned and which are relatively robust against the permeation of moisture so generation of defects in case that moisture permeates from the outside may be prevented.

Similar to the embodiment of FIGS. 4 and 5, the global clock signal wire 580 may be positioned in the second area DWA2, and the carry clock signal wire 570 may be positioned in the fourth area DWA4. For example, the global clock signal wire 580 and the carry clock signal wire 570 that are robust against the permeation of moisture may be disposed respectively in the second area DWA2 and the fourth area DWA4 in which the organic structure is positioned and which are relatively weak against the permeation of moisture.

A display device according to an embodiment will now be described with reference to FIG. 9 and FIG. 10.

Figure 9:
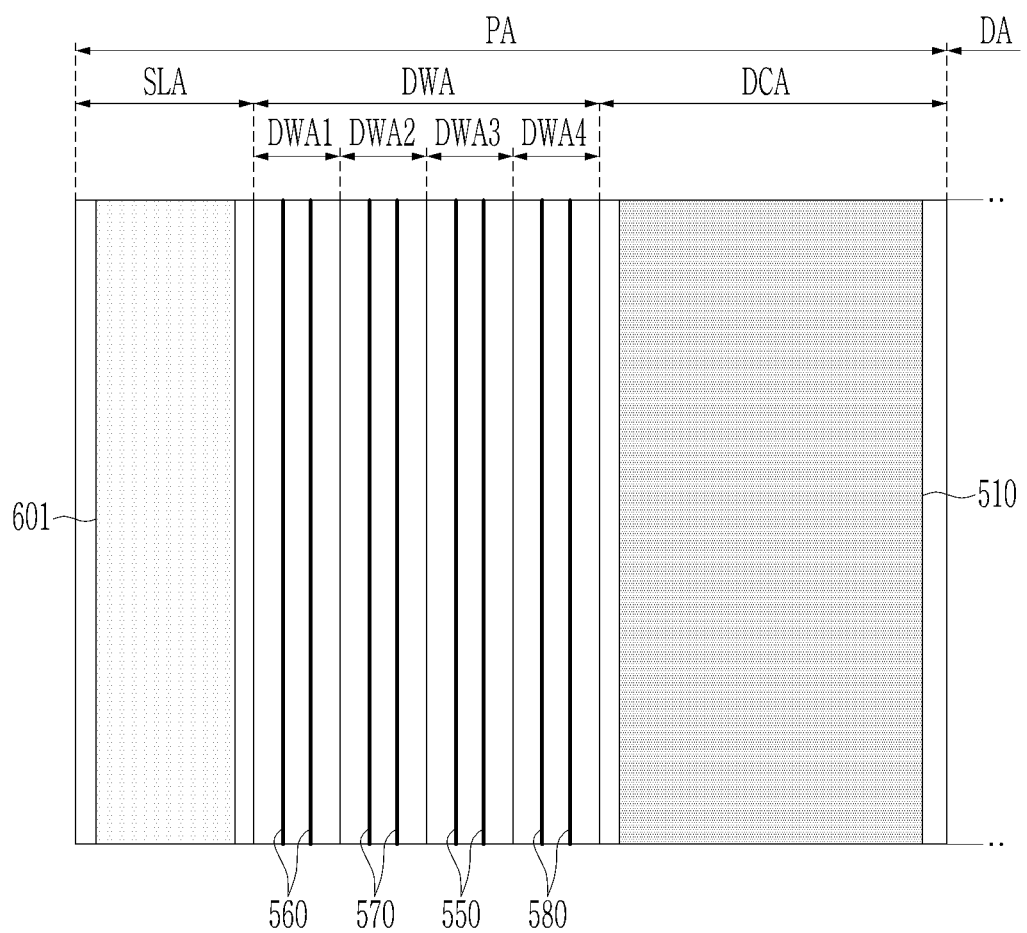
FIG. 9 shows a top plan view of a peripheral area of a display device according to an embodiment.
Figure 10:
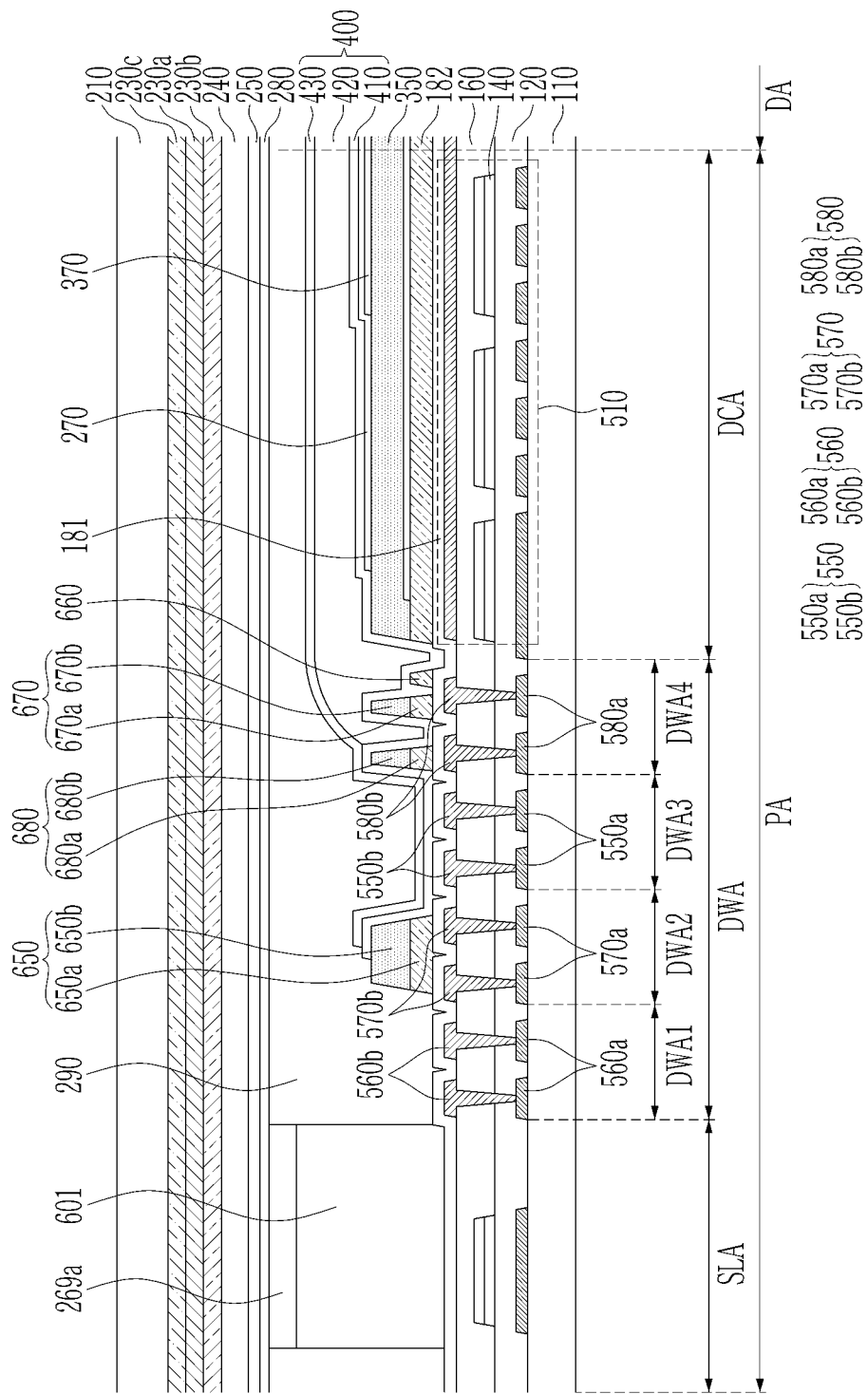
FIG. 10 shows a schematic cross-sectional view of a peripheral area of a display device according to an embodiment.

The display device according to an embodiment shown in FIG. 9 and FIG. 10 is similar to the display device according to an embodiment shown in FIG. 1 to FIG. 5, and no same portions will be described. Arrangement of the wires positioned in the driving wire area according to the embodiment is different from that of the embodiment of FIGS. 7 and 8, which will now be described.

FIG. 9 shows a top plan view of a peripheral area of a display device according to an embodiment, and FIG. 10 shows a schematic cross-sectional view of a peripheral area of a display device according to an embodiment.

As shown in FIG. 9 and FIG. 10, the display device may include a display area DA and a peripheral area PA. The peripheral area PA may include a driving circuit area DCA, a driving wire area DWA, and a sealing area SLA. The driving wire area DWA may include a first area DWA1, a second area DWA2, a third area DWA3, and a fourth area DWA4.

The display device may include a display panel 1000 and a color conversion panel 2000 disposed to face each other, and a filling layer 290 and a sealing member 601 may be positioned between the display panel 1000 and the color conversion panel 2000. The sealing member 601 may be positioned in the sealing area SLA. The display panel 1000 may include a first substrate 110, and multiple wires 550, 560, 570, and 580 and a gate driver 510 positioned on the first substrate 110. The wires 550, 560, 570, and 580 may be positioned in the driving wire area DWA, and the gate driver 510 may be positioned in the driving circuit area DCA.

In the embodiment of FIGS. 7 and 8, the global clock signal wire 580 may be positioned in the second area DWA2, and the carry clock signal wire 570 may be positioned in the fourth area DWA4. In the embodiment of FIGS. 9 and 10, positions of the carry clock signal wire 570 and the global clock signal wire 580 may be exchanged. For example, the carry clock signal wire 570 may be positioned in the second area DWA2, and the global clock signal wire 580 may be positioned in the fourth area DWA4. The difference of robustness degrees against the permeation of moisture between the carry clock signal wire 570 and the global clock signal wire 580 is not great so the defects due to permeation of moisture may be prevented similar to the embodiment of FIGS. 7 and 8. For example, the carry clock signal wire 570 and the global clock signal wire 580 that are robust against permeation of moisture may be respectively disposed in the second area DWA2 and the fourth area DWA4 in which the organic structure is positioned and which are relatively weak against the permeation of moisture so generation of defects when moisture permeates from the outside may be prevented.

Similar to the embodiment of FIGS. 4 and 5, the sensing clock signal wire 560 may be positioned in the first area DWA1, and the scan clock signal wire 550 may be positioned in the third area DWA3. For example, the sensing clock signal wire 560 and the scan clock signal wire 550 that are weak against the permeation of moisture may be respectively disposed in the first area DWA1 and the third area DWA3 in which the organic structure is not positioned and which are relatively robust against the permeation of moisture.

A display device according to an embodiment will now be described with reference to FIG. 11 and FIG. 12.

Figure 11:
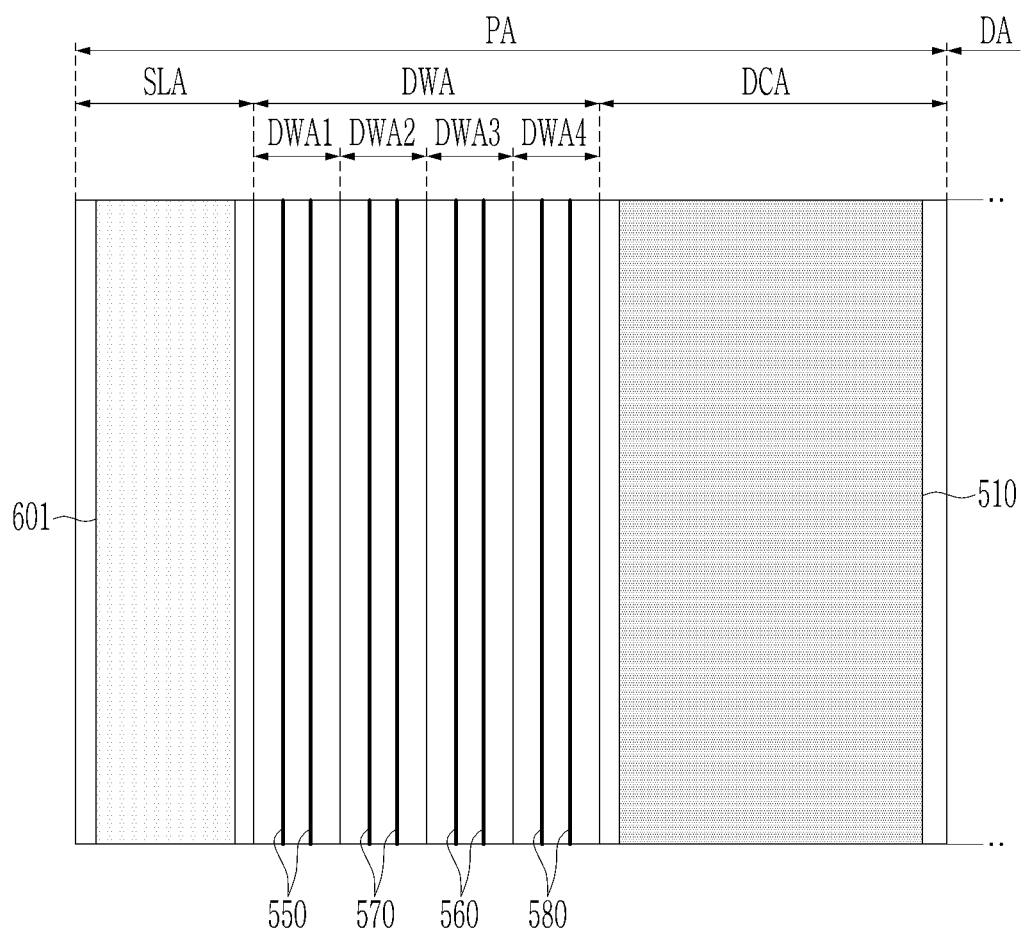
FIG. 11 shows a top plan view of a peripheral area of a display device according to an embodiment.
Figure 12:
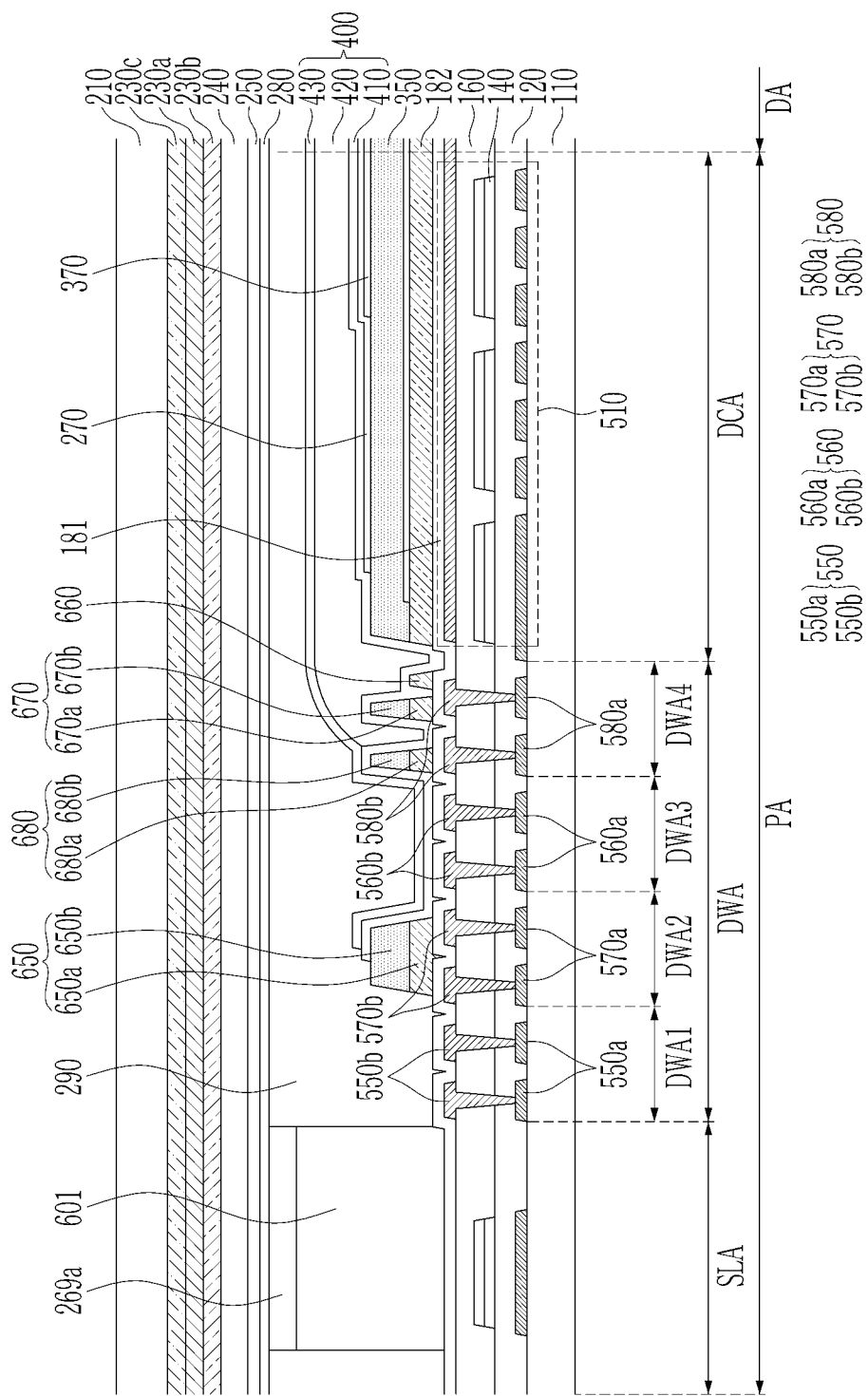
FIG. 12 shows a schematic cross-sectional view of a peripheral area of a display device according to an embodiment.

The display device according to an embodiment shown in FIG. 11 and FIG. 12 is similar to the display device according to an embodiment shown in FIG. 9 to FIG. 10, and same portions will not be described. Arrangement of the wires positioned in the driving wire area according to the embodiment in FIGS. 11 and 12 is different from that of the previous embodiments, which will now be described.

FIG. 11 shows a top plan view of a peripheral area of a display device according to an embodiment, and FIG. 12 shows a schematic cross-sectional view of a peripheral area of a display device according to an embodiment.

As shown in FIG. 11 and FIG. 12, the display device may include a display area DA and a peripheral area PA. The peripheral area PA may include a driving circuit area DCA, a driving wire area DWA, and a sealing area SLA. The driving wire area DWA may include a first area DWA1, a second area DWA2, a third area DWA3, and a fourth area DWA4.

The display device may include a display panel 1000 and a color conversion panel 2000 disposed to face each other, and a filling layer 290 and a sealing member 601 may be positioned between the display panel 1000 and the color conversion panel 2000. A sealing member 601 may be positioned in the sealing area SLA. The display panel 1000 may include a first substrate 110, and multiple wires 550, 560, 570, and 580 and a gate driver 510 positioned on the first substrate 110. The wires 550, 560, 570, and 580 may be positioned in the driving wire area DWA, and the gate driver 510 may be positioned in the driving circuit area DCA.

In the embodiment of FIGS. 9 and 10, the sensing clock signal wire 560 may be positioned in the first area DWA1, and the scan clock signal wire 550 may be positioned in the third area DWA3. In the embodiment of FIGS. 11 and 12, positions of the sensing clock signal wire 560 and the scan clock signal wire 550 may be exchanged. For example, the scan clock signal wire 550 may be positioned in the first area DWA1, and the sensing clock signal wire 560 may be positioned in the third area DWA3. The difference of robustness degrees on the permeation of moisture between the scan clock signal wire 550 and the sensing clock signal wire 560 is not great so the defects due to permeation of moisture may be prevented similar to the embodiment of FIGS. 9 and 10. For example, the scan clock signal wire 550 and the sensing clock signal wire 560 that are weak against the permeation of moisture may be respectively disposed in the first area DWA1 and the third area DWA3 in which the organic structure is not positioned and which are relatively robust against the permeation of moisture so generation of defects when moisture permeates from the outside may be prevented.

Similar to the embodiment of FIGS. 9 and 10, the carry clock signal wire 570 may be positioned in the second area DWA2, and the global clock signal wire 580 may be positioned in the fourth area DWA4. For example, the carry clock signal wire 570 and the global clock signal wire 580 that are robust against the permeation of moisture may be respectively disposed in the second area DWA2 and the fourth area DWA4 in which the organic structure is positioned and which are relatively weak against the permeation of moisture.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a display panel including a display area, a driving circuit area, a driving wire area, and a sealing area, wherein the display panel further includes:
        a first substrate;
        a plurality of light-emitting devices disposed on the first substrate in the display area;
        a gate driver disposed on the first substrate in the driving circuit area and supplying a signal for driving the plurality of light-emitting devices;
        a plurality of wires disposed on the first substrate in the driving wire area and transmitting a clock signal to the gate driver; and
        an organic structure disposed on the first substrate in the driving wire area,
    the plurality of wires include:
        a scan clock signal wire for transmitting a scan clock signal; and
        a sensing clock signal wire for transmitting a sensing clock signal, and
    the scan clock signal wire and the sensing clock signal wire do not overlap the organic structure in a plan view.

2. The display device of claim 1, wherein
    the plurality of wires further include:
        a carry clock signal wire for transmitting a carry clock signal; and
        a global clock signal wire for transmitting a global clock signal, and
    the carry clock signal wire and the global clock signal wire overlap the organic structure in a plan view.

3. The display device of claim 2, wherein
    the driving circuit area is disposed adjacent to the display area,
    the sealing area is disposed adjacent to an edge of the display device, and
    the driving wire area is disposed between the driving circuit area and the sealing area.

4. The display device of claim 3, further comprising:
    an encapsulation layer disposed on the plurality of light-emitting devices and the organic structure, wherein
    the driving wire area includes a first area, a second area, a third area, and a fourth area,
    the encapsulation layer is disposed in the display area, the driving circuit area, and the third area and the fourth area of the driving wire area, and
    the organic structure is disposed in the second area and the fourth area of the driving wire area.

5. The display device of claim 4, wherein the organic structure includes:

a support disposed in the second area; and
a dam disposed in the fourth area.

6. The display device of claim 4, wherein the organic structure is not disposed in the first area and the third area of the driving wire area.

7. The display device of claim 4, wherein at least one of the scan clock signal wire and the sensing clock signal wire is disposed in one of the first area and the third area.

8. The display device of claim 4, wherein at least one of the carry clock signal wire and the global clock signal wire is disposed in one of the second area and the fourth area.

9. The display device of claim 4, wherein
the sensing clock signal wire is disposed in the first area,
the global clock signal wire is disposed in the second area,
the scan clock signal wire is disposed in the third area, and
the carry clock signal wire is disposed in the fourth area.

10. The display device of claim 4, wherein
the scan clock signal wire is disposed in the first area,
the global clock signal wire is disposed in the second area,
the sensing clock signal wire is disposed in the third area, and
the carry clock signal wire is disposed in the fourth area.

11. The display device of claim 4, wherein
the sensing clock signal wire is disposed in the first area,
the carry clock signal wire is disposed in the second area,
the scan clock signal wire is disposed in the third area, and
the global clock signal wire is disposed in the fourth area.

12. The display device of claim 4, wherein
the scan clock signal wire is disposed in the first area,
the carry clock signal wire is disposed in the second area,
the sensing clock signal wire is disposed in the third area, and
the global clock signal wire is disposed in the fourth area.

13. The display device of claim 4, wherein the encapsulation layer is disposed in a partial area of the second area of the driving wire area.

14. The display device of claim 4, wherein
the encapsulation layer includes a first inorganic encapsulation layer, an organic encapsulation layer, and a second inorganic encapsulation layer,
the first inorganic encapsulation layer, the organic encapsulation layer and the second inorganic encapsulation layer are sequentially stacked in the display area, the driving circuit area, and a partial area of the fourth area,
the organic encapsulation layer is not disposed in the third area, and
the second inorganic encapsulation layer is disposed on the first inorganic encapsulation layer in the third area.

15. The display device of claim 3, further comprising:
a color conversion panel facing the display panel;
a sealing member disposed in the sealing area between the display panel and the color conversion panel; and
a dummy spacer overlapping the sealing member in a plan view.

16. The display device of claim 15, wherein
the color conversion panel includes:
a second substrate;
a first color filter, a second color filter, and a third color filter disposed on a side of the second substrate;
a first color converting layer overlapping the first color filter in a plan view;
a second color converting layer overlapping the second color filter in a plan view;
a transmission layer overlapping the third color filter in a plan view;
a bank disposed between at least two of the first color converting layer, the second color converting layer, and the transmission layer; and
a spacer disposed on the bank, and
the dummy spacer and the spacer are disposed on a same layer.

17. The display device of claim 2, further comprising:
a transistor disposed on the first substrate in the display area and electrically connected to the plurality of light-emitting devices,
wherein at least some of the plurality of wires and at least a part of the transistor are disposed on a same layer.

18. The display device of claim 17, wherein
each of the plurality of wires includes a lower wire and an upper wire electrically connected to each other, and
an insulating layer is disposed between the lower wire and the upper wire and includes a plurality of openings to electrically connect the upper wire and the lower wire.

19. The display device of claim 18, wherein
the transistor includes:
an oxide semiconductor;
a gate electrode overlapping the oxide semiconductor in a plan view; and
a first electrode and a second electrode electrically connected to the oxide semiconductor, and
the upper wire of each of the plurality of wires, the first electrode, and the second electrode are disposed on a same layer.

20. The display device of claim 18, further comprising:
a light blocking layer disposed between the first substrate and the oxide semiconductor,
wherein the lower wire of each of the plurality of wires and the light blocking layer are disposed on a same layer.

* * * * *